United States Patent
Nayebi et al.

(10) Patent No.: US 11,405,116 B2
(45) Date of Patent: Aug. 2, 2022

(54) SYSTEMS AND METHODS FOR MITIGATING IN-PHASE AND QUADRATURE MISMATCH

(71) Applicant: Samsung Electronics Co., Ltd., Suwon-si (KR)

(72) Inventors: Elina Nayebi, San Diego, CA (US); Pranav Dayal, San Diego, CA (US); Kee-Bong Song, San Diego, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/117,683

(22) Filed: Dec. 10, 2020

(65) Prior Publication Data

US 2021/0367687 A1    Nov. 25, 2021

Related U.S. Application Data

(60) Provisional application No. 63/025,983, filed on May 15, 2020.

(51) Int. Cl.
*H04B 17/15* (2015.01)
*H04B 15/00* (2006.01)
*H04B 17/29* (2015.01)

(52) U.S. Cl.
CPC ............. *H04B 17/15* (2015.01); *H04B 15/00* (2013.01); *H04B 17/29* (2015.01)

(58) Field of Classification Search
CPC ..................................................... H04B 17/15
USPC ......................................................... 375/227
See application file for complete search history.

(56) References Cited

U.S. PATENT DOCUMENTS

| | | | | |
|---|---|---|---|---|
| 7,596,282 | B2* | 9/2009 | Chang | G06K 9/4609 382/260 |
| 8,064,542 | B1* | 11/2011 | Lee | H03D 3/009 375/324 |
| 8,265,584 | B2 | 9/2012 | Khoury et al. | |
| 8,284,824 | B1* | 10/2012 | Smaini | H04B 1/40 375/221 |
| 8,948,326 | B2* | 2/2015 | Primo | H04B 1/30 375/346 |
| 2005/0148304 | A1* | 7/2005 | Jerng | H04B 1/30 455/75 |
| 2013/0099874 | A1* | 4/2013 | Bromberger | G06F 30/394 333/32 |

(Continued)

*Primary Examiner* — Lihong Yu
(74) *Attorney, Agent, or Firm* — Lewis Roca Rothgerber Christie LLP

(57) ABSTRACT

A method of optimizing at least one IQMC parameter value for an IQMC includes: generating a set of tested IQMC candidate parameter values by performing an iterative method including selecting a first IQMC candidate parameter value for the at least one parameter of the IQMC; determining, using the first IQMC candidate parameter value, a performance metric value that comprises at least one of (i) an image rejection ratio (IRR) value, (ii) a signal-to-interference-plus-noise ratio (SINR) value, or (iii) a signal-to-image ratio (SImR) value; and determining a second IQMC candidate parameter value that is an update to the first IQMC candidate parameter value. The method of optimizing at least one IQMC parameter value for an IQMC further includes determining an IQMC candidate parameter value of the set of tested IQMC candidate parameter values that optimizes the performance metric.

20 Claims, 10 Drawing Sheets

(56) References Cited

U.S. PATENT DOCUMENTS

2016/0278089 A1\* 9/2016 Lee .......................... H04L 5/14
2019/0097866 A1    3/2019 Sestok, IV
2020/0099408 A1    3/2020 Nayebi \* cited by examiner

SYSTEMS AND METHODS FOR MITIGATING IN-PHASE AND QUADRATURE MISMATCH

CROSS-REFERENCE TO RELATED APPLICATIONS

This application is based on and, under 35 U.S.C. § 119(e), claims priority to U.S. Provisional Patent Application No. 63/025,983, filed on May 15, 2020 in the United States Patent and Trademark Office. The entire contents of U.S. Provisional Patent Application No. 63/025,983 are incorporated herein by reference.

FIELD

The present disclosure is generally related to communication systems or devices. In particular, the present disclosure is related to systems and methods for increasing a performance of communication systems or devices that may exhibit an in-phase (I) and quadrature (Q) mismatch. The I and Q mismatch may be referred to herein as "IQMM."

BACKGROUND

An imbalance between I and Q branches of quadrature transmitters (TXs) or receivers (RXs) can create interference between the certain frequencies after up-conversion or down-conversion. The IQMM may be caused by non-ideal characteristics of I and Q paths, and may degrade the TX or RX performance by reducing an effective signal to interference ratio. Hence, compensation of IQMM for the TX and/or RX of the quadrature transceivers can be helpful.

SUMMARY

According to some embodiments, a method of optimizing at least one in-phase (I) and quadrature (Q) mismatch compensator (MC) parameter value for at least one IQMC parameter of an IQMC includes: generating a set of tested IQMC candidate parameter values by performing an iterative method until an exit condition is reached, and determining an IQMC candidate parameter value of the set of tested IQMC candidate parameter values that optimizes the performance metric. At least one iteration of the iterative method includes: selecting a first IQMC candidate parameter value for the at least one parameter of the IQMC; determining, using the first IQMC candidate parameter value, a performance metric value that comprises at least one of (i) an image rejection ratio (IRR) value, (ii) a signal-to-interference-plus-noise ratio (SINR) value, or (iii) a signal-to-image ratio (SImR) value; and determining a second IQMC candidate parameter value that is an update to the first IQMC candidate parameter value. The set of tested IQMC test parameters includes at least the first IQMC candidate parameter value and the second IQMC candidate parameter value.

According to some embodiments, a device configured to optimize at least one IQMC parameter value for at least one IQMC parameter of an IQMC includes a processor, and non-transitory processor-executable media storing instructions that, when executed by the processor, cause the processor to: generate a set of tested IQMC candidate parameter values by performing an iterative method until an exit condition is reached, and determine an IQMC candidate parameter value of the set of tested IQMC candidate parameter values that optimizes the performance metric. At least one iteration of the iterative method includes: selecting a first IQMC candidate parameter value for the at least one parameter of the IQMC; determining, using the first IQMC candidate parameter value, a performance metric value that comprises at least one of (i) an image rejection ratio (IRR) value, (ii) a signal-to-interference-plus-noise ratio (SINR) value, or (iii) a signal-to-image ratio (SImR) value; and determining a second IQMC candidate parameter value that is an update to the first IQMC candidate parameter value. The set of tested IQMC test parameters includes at least the first IQMC candidate parameter value and the second IQMC candidate parameter value.

BRIEF DESCRIPTION OF THE DRAWINGS

Aspects, features, and advantages of certain embodiments of the present disclosure will be readily apparent from the following detailed description and the accompanying drawings.

DETAILED DESCRIPTION

Figure 1A:
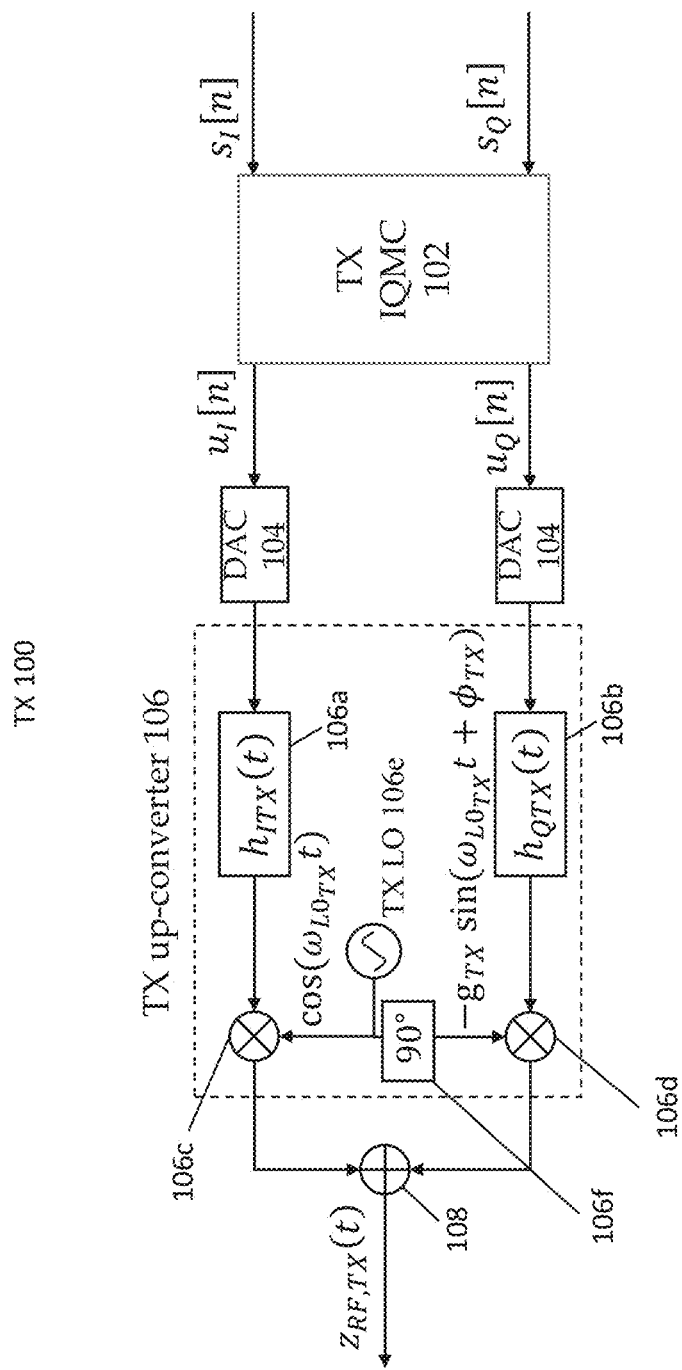
FIG. 1A shows a diagram of at least a portion of a quadrature transmitter, according to some embodiments.

The image rejection ratio (IRR) can be an IQMC performance metric, and may be defined as a function of (i) a signal level produced by the wanted input frequency and (ii) a signal level produced by the unwanted image frequency. The function may be, or may involve or include, a ratio of those two quantities. Certain embodiments described herein involve one or more techniques (e.g., including an iterative technique, a machine learning technique, a gradient ascent or gradient descent technique, or other technique) that can be used to obtain IQMC parameters that improve (e.g., maximize) an IRR of a TX or of an RX. For example, the present disclosure provides one or more solutions using a gradient ascent (or descent) search approach to solve an IRR optimization problem and provides for finding a gradient of an IRR related cost function in closed form as a function of IQ impairment parameters and IQMC parameters for compensator architectures in TX and RX.

The IRR of the TX or RX can be frequency dependent, and the IRR that is optimized or maximized (via, at least in part, selection or setting of TX or RX of IQMC parameters)

may be a smallest IRR of a set of IRRs respectively corresponding to a set of frequencies (e.g., corresponding to a desired frequency band). In some embodiments, the IRR that is maximized may be another IRR (e.g., may be a mean or median IRR of the set of IRRs).

Signal-to-interference-plus-noise ratio (SINR) can be an IQMC performance metric and may be defined as a function of (i) a power of a signal of interest, (ii) an interference power (from one or more (e.g., all) interfering signals), and (iii) a power of a background noise. By way of example, the SINR may be defined as a function of the power of the signal of interest and an aggregation of (e.g., addition of) the interference power and the power of the background noise. By way of a more a specific example, the SINR may be a function of (e.g., may be equal to) a ratio of (i) the power of the signal of interest and (ii) the addition of the interference power and the power of the background noise. For example, the present disclosure provides one or more solutions using a gradient ascent (or descent) search approach to solve an SINR optimization problem and provides for finding a gradient of an SINR related cost function in closed form as a function of IQ impairment parameters and IQMC parameters for compensator architectures in TX and RX.

The SINR of the TX or RX can be frequency dependent, and the SINR that is maximized (via, at least in part, selection or setting of TX or RX of IQMC parameters) may be a smallest SINR of a set of SINRs respectively corresponding to a set of frequencies (e.g., corresponding to a desired frequency band). In some embodiments, the SINR that is maximized may be another SINR (e.g., may be a mean or median SINR of the set of SINRs).

Signal-to-image ratio (SImR) can be an IQMC performance metric and may be defined as a function of (i) a signal level at a desired frequency to (ii) a signal level at an interfering frequency (e.g., the image frequency). The function may be indicative of a relative strength of the signal level at the desired frequency and the signal level at the interfering frequency (e.g., may be a ratio), or may be indicative of an absolute strength of the signal level at the desired frequency and the signal level at the interfering frequency. Certain embodiments described herein involve one or more techniques (e.g., including an iterative technique, a machine learning technique, a gradient ascent or gradient descent technique, or other technique) that can be used to obtain IQMC parameters that improve (e.g., maximize) an SImR of a TX or of an RX. For example, the present disclosure provides one or more solutions using a gradient ascent (or descent) search approach to solve an SImR optimization problem and provides for finding a gradient of an SImR related cost function in closed form as a function of IQ impairment parameters and IQMC parameters for compensator architectures in TX and RX.

The SImR of the TX or RX can be frequency dependent, and the SImR that is maximized (via, at least in part, selection or setting of TX or RX of IQMC parameters) may be a smallest SImR of a set of SImRs respectively corresponding to a set of frequencies (e.g., corresponding to a desired frequency band). In some embodiments, the SImR that is maximized may be another SImR (e.g., may be a mean or median SImR of the set of SImRs).

Herein, certain references to, and/or description of, at least one of the performance metrics discussed above (IRR, SINR, and SImR) may be applicable to the other performance metrics, as may be apparent from the context.

Certain techniques described herein provide for optimizing IQMC parameters for an IQMC compensator, or for determining or generating optimized IQMC parameters for an IQMC compensator. The terms optimizing or optimized, as used herein, can refer to improving or improved. For example, optimizing an IRR value, an SINR value, or an SImR value can refer to increasing the IRR value, the SINR value, or the SImR value. An optimized IRR value, SINR value, or SImR value can refer to a largest IRR value, SINR value, or SImR value of a set of IRR values, SINR values, or SImR values (e.g., a set of tested values, default values, or other reference values).

FIG. 1A shows a diagram of at least a portion of a TX 100, according to some embodiments. Note that although the example TX 100 depicted in FIG. 1A is a zero-intermediate frequency (IF) TX, in other embodiments, the TX may be implemented as a non-zero IF TX, and the techniques described herein can still be applied. FIG. 1A also depicts an I and Q signal transmission path in the TX 100. The TX 100 may be a stand-alone TX, or may be included in a transceiver device or system, or any other appropriate communication device or system. The TX 100 includes one or more of a TX IQMC 102, a digital-to-analog converter (DAC) 104, a TX up-converter 106, and a signal aggregator 108.

As a brief overview, and as shown by the arrows depicted in FIG. 1A, an in-phase signal $s_I[n]$ (where "n" is a time index—note that as used herein, certain lower case symbols may be used to indicate a function in a time domain, and certain upper case symbols may be used to indicate a function in a frequency domain) that is, e.g., intended for transmission, is input to the TX IQMC 102. A quadrature signal $s_Q[n]$ (that is, e.g., intended for transmission) is also input to the TX IQMC 102. The TX IQMC 102 processes the $s_I[n]$ signal and the $s_Q[n]$ signal, and responsively outputs a compensated signal $u_I[n]$ to a DAC 104, and responsively outputs a compensated signal $u_Q[n]$ to a DAC 104. Note that $u_I[n]$ can be a function of both $s_I[n]$ and $s_Q[n]$, and $u_Q[n]$ can be a function of both $s_I[n]$ and $s_Q[n]$.

The DAC 104 converts the compensated signal $u_I[n]$ to an analog I signal, and outputs the analog I signal to the TX up-converter 106. The TX up-converter 106 up-converts the analog I signal and outputs the up-converted analog I signal to the signal aggregator 108. Note that throughout this specification, the $s_I[n]$ signal, the $u_I[n]$ signal, the analog I signal, and the up-converted analog I signal may be referred to as an I signal.

The DAC 104 converts the compensated signal $u_Q[n]$ to an analog Q signal, and outputs the analog Q signal to the TX up-converter 106. The TX up-converter 106 up-converts the analog Q signal and outputs the up-converted analog Q signal to the signal aggregator 108. Note that throughout this specification, the $s_Q[n]$ signal, the $u_Q[n]$ signal, the analog Q signal, and the up-converted analog Q signal may be referred to as a Q signal.

The signal aggregator 108 is configured to aggregate (e.g., add) the analog I signal and the analog Q signal to generate an upconverted signal Z that is appropriate for transmission. The signal Z is labeled $Z_{RF,TX}(t)$ in FIG. 1A to indicate that it is a signal that varies in the time domain and that is output by a TX at a radio frequency (RF).

Referring to the TX up-converter 106, the TX up-converter is configured to up-convert signals from a baseband frequency to an RF frequency more appropriate for transmission. The TX up-converter 106 includes a 106a, a filter 106b, a mixer 106c, a mixer 106d, a TX local oscillator (LO) 106e, and a phase shifter 106f.

The filter 106a may be any appropriate filter, such as an analog, baseband, and/or low-pass filter. The filter 106a may be an analog baseband (ABB) filter. The filter 106a may have an impulse response represented by $h_{ITX}(t)$. The filter 106b may be similar to the filter 106a, and may have similar features, characteristics, structure, and/or functionality as the filter 106a. The filter 106b may have an impulse response represented by $h_{QTX}(t)$. A mismatch between the impulse responses $h_{ITX}(t)$ and $h_{QTX}(t)$ ($h_{ITX}(t) \neq h_{QTX}(t)$) on the I and Q paths of the TX 100 may create frequency-dependent IQ mismatch (FD-IQMM). Such mismatches may degrade the IRR, the SINR, and/or the SImR of the TX 100 (e.g., as discussed in detail herein).

The mixer 106c may be any appropriate mixer for a TX up-converter. In general, a mixer may perform operations on input signals, such as multiplying two input signals. The mixer 106d may be similar to the mixer 106c, and may have any of the features, characteristics, structure, and/or functionality as the mixer 106c.

The TX LO 106e supplies a signal to the mixer 106c, and the signal 106e can be expressed as $\cos(\omega_{LO_{TX}} t)$, where $\omega_{LO_{TX}}$ is an angular frequency of the TX LO 106e. The TX LO 106e also supplies a signal (ideally, the same or a similar signal as the signal that the TX LO 106e supplies to mixer 106c) to the phase shifter 106f, which shifts (e.g., delays) the phase by 90° or approximately 90° and supplies the delayed signal to the mixer 106d. Thus, the mixer 106d may ideally be supplied with a signal that is the same as, or similar to, the signal supplied to the mixer 106c, but shifted by 90° or approximately 90°. However, certain non-ideal mismatches may occur in practice that cause the signals actually supplied to the mixers 106c and 106d (e.g., by the TX LO 106e and/or the phase shifter 106f) to deviate from this ideal, or certain non-ideal characteristics of the mixers may cause the signals to be processed differently from an ideal mixing, and at least some of these non-ideal mismatches or characteristics may be expressed as $g_{TX}$ (mismatch gain) and $\phi_{TX}$ (mismatch phase offset) in the following formula which represents the signal that is input to the mixer 106d:

$$-g_{TX}\sin(\omega_{LO_{TX}} t + \phi_{TX}) \quad (1).$$

When $g_{TX} \neq 1$ and/or $\phi_{TX} \neq 0$, there is a frequency-independent (FI) IQ mismatch in the TX 100. Such mismatches may degrade the IRR, the SINR, and/or the SImR of the TX 100 (e.g., as discussed in detail herein).

The frequency response of the baseband equivalent of the upconverted signal in the TX path (at the output of mixers) in frequency-domain is given by $$Z_{TX}(f) = G_{1TX}(f)U(f) + G_{2TX}(f)U^*(-f) + N_{TX}(f), \quad (2)$$

where $U(f)$ is the frequency response of the baseband TX signal, $N_{TX}(f)$ represents additive TX noise, and $G_{1TX}(f)$ and $G_{2TX}(f)$ are defined as $$G_{1TX}(f) = \frac{H_{ITX}(f) + g_{TX} e^{j\phi_{TX}} H_{QTX}(f)}{2}, \quad (3)$$

$$G_{2TX}(f) = \frac{H_{ITX}(f) - g_{TX} e^{j\phi_{TX}} H_{QTX}(f)}{2},$$

where $H_{ITX}(f)$ and $H_{QTX}(f)$ in (3) denote the frequency responses of in-phase filter 106a and quadrature filter 106b, respectively. Without any IQMM ($g_{TX}=1$, $\phi_{TX}=0$, and $H_{ITX}(f) = H_{QTX}(f)$), $G_{2TX}(f)$ and consequently the second term in (2) become zero. Without any IQMC, IRR can then be expressed as (by way of example):

$$IRR_{TX}(f) = \frac{|G_{1TX}(f)|^2}{|G_{2TX}(f)|^2}, \quad (4)$$

which becomes infinite in case of no IQMM since $G_{2TX}(f) = 0$. However, when $G_{2TX}(f)$ is non-zero and when there is some IQMM, the IRR is finite. Other IQMC performance parameters such as SINR and SImR may similarly be large without any IQMM, and may be small when $G_{2TX}(f)$ is non-zero and when there is some IQMM.

The TX IQMC 102 may compensate for IQMM, including the IQ mismatches described above, thereby increasing the IRR, the SINR, and/or the SImR of the TX 100. The TX IQMC 102 may include, for example, one or more of a CVC IQMC (e.g., the TX CVC IQMC 202 shown in FIG. 2A or the TX CVC IQMC 203 shown in FIG. 2B), or an RVC IQMC (e.g., the TX RVC IQMC 204 shown in FIG. 2C). The TX IQMC 102 may include one or more components, certain examples of which are described below at least in reference to FIG. 2A, FIG. 2B, and FIG. 2C. Certain parameters of those components (or certain parameters of the IQMC itself) may be referred to herein as IQMC parameters, or IQMC coefficients. The present disclosure provides for determining, selecting, setting, and/or updating IQMC parameters for the TX IQMC 102 (e.g., using an iterative technique such as the IQMC parameter optimization method 300 shown in FIG. 3) such that an IRR, and SINR, and/or an SImR of the TX 100 is optimized.

Figure 1B:
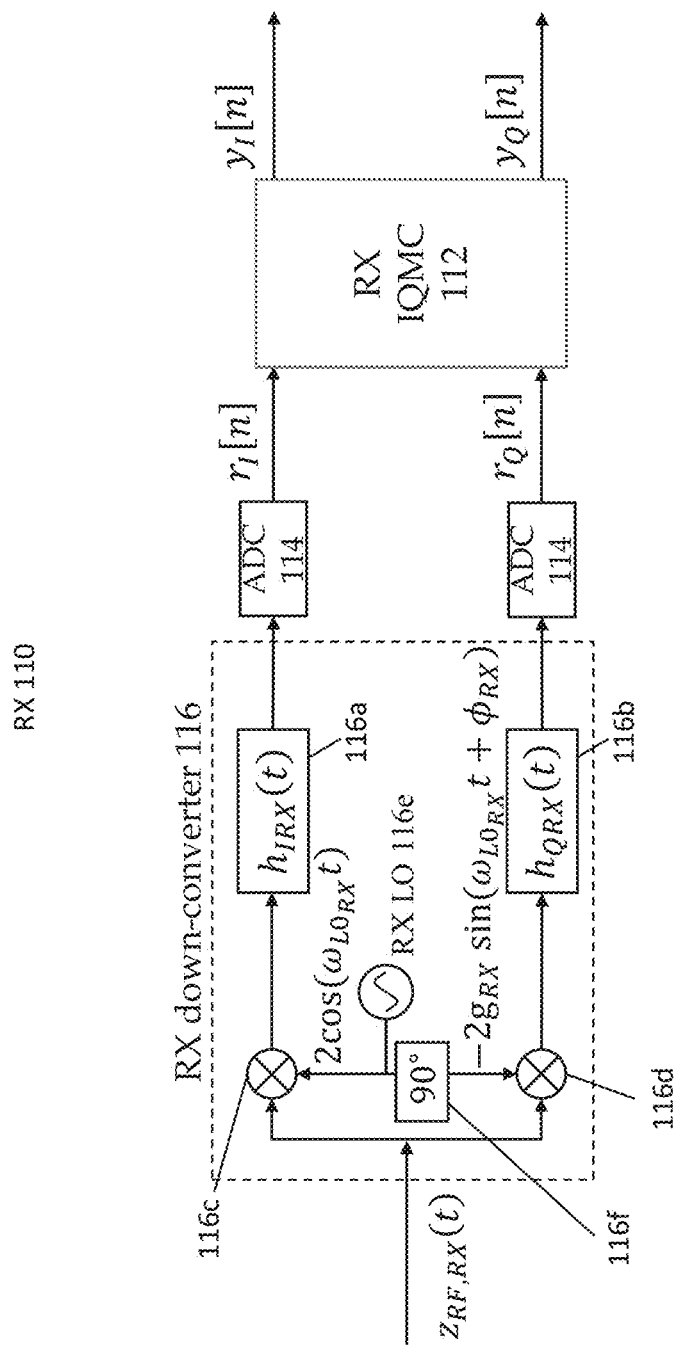
FIG. 1B shows a diagram of at least a portion of a quadrature receiver, according to some embodiments.

FIG. 1B shows a diagram of at least a portion of an RX 110, according to some embodiments. Note that although the example RX 110 depicted in FIG. 1B is a zero-IF RX, in other embodiments, the RX may be implemented as a non-zero IF RX, and the techniques described herein can still be applied. FIG. 1B also depicts an I and Q signal reception path in the RX 110. The RX 110 may be a stand-alone RX, or may be included in a transceiver device or system, or any other appropriate communication device or system. The RX 110 includes one or more of an RX IQMC 112, an analog-to-digital converter (ADC) 114, and an RX down-converter 116.

As a brief overview, and as shown by the arrows depicted in FIG. 1B, a signal Z is received by the RX 110, and is input to the RX down-converter 116. The signal Z is labeled $Z_{RF, RX}(t)$ in FIG. 1B to indicate that it is a signal that varies in the time domain and that is input to an RX at an RF frequency. The RX down-converter 116 down-converts the signal Z and outputs an analog I signal and an analog Q signal, which are respectively sent to ADCs 114. One of the ADCs 114 converts the analog I signal to a digital I signal $r_I[n]$, and another of the ADCs 114 converts the analog Q signal to a digital Q signal $r_Q[n]$. The signal $r_I[n]$ and the signal $r_Q[n]$ are sent to the RX IQMC 112, which compensates for RX IQ mismatch, thereby generating a compensated I signal $y_I[n]$ and a compensated Q signal $y_Q[n]$, which may be further processed or used by the RX 110 or by a connected component or device. The compensated I signal $y_I[n]$ may be a function of one or both of the digital I signal $r_I[n]$ and the digital Q signal $r_Q[n]$. The compensated Q signal $y_Q[n]$ may be a function of one or both of the digital I signal $r_I[n]$ and the digital Q signal $r_Q[n]$.

Referring to the RX down-converter 116 in more detail, the RX down-converter 116 is configured to down-convert signals from an RF frequency to a baseband frequency. The RX down-converter 116 includes a filter 116a, a filter 116b, a mixer 116c, a mixer 116d, a TX local oscillator (LO) 116e, and a phase shifter 116f.

The mixer 116c may be any appropriate mixer for an RX down-converter. As mentioned above, in general, a mixer may perform operations on input signals, such as multiplying two input signals. The mixer 116c may receive the Z signal and a signal from the RX LO 116e, and may mix them to generate an output that is sent to the filter 116a. The mixer 116d may receive the Z signal and a signal from the RX LO 116e (e.g., via the phase shifter 116f), and may mix them to generate an output that is sent to the filter 116b. The mixer 116d may be similar to the mixer 116c, and may have any of the features, characteristics, structure, and/or functionality as the mixer 116c.

The RX LO 116e supplies a signal to the mixer 116c, and the signal can be expressed as: $2\cos(\omega_{LO_{RX}}t)$, where $\omega_{LO_{RX}}$ is an angular frequency of the RX LO 116e. The RX LO 116e also supplies a signal (ideally, the same or a similar signal as the signal that the RX LO 116e supplies to mixer 116c) to the phase shifter 116f, which shifts (e.g., delays) the phase by 90° or approximately 90° and supplies the shifted signal to the mixer 116d. Thus, the mixer 116d may ideally be supplied with a signal that is the same as, or similar to, the signal supplied to the mixer 116c, but shifted by 90° or approximately 90°. However, certain non-ideal mismatches may occur in practice that cause the signals actually supplied to the mixers 116c and 116d (e.g., by the TX LO 106e and/or the phase shifter 106f) to deviate from this ideal, or certain non-ideal characteristics of the mixers may cause the signals to be processed differently from an ideal mixing, and at least some of the non-ideal mismatches may be expressed as $g_{TX}$ (mismatch gain) and $\phi_{TX}$ (mismatch phase offset) in the following formula, which represents the signal that is input to the mixer 106d:

$$-2g_{RX}\sin(\omega_{LO_{RX}}t+\phi_{RX}) \quad (5).$$

When $g_{RX}\neq 1$ and/or $\phi_{RX}\neq 0$, there is a frequency-independent (FI) IQ mismatch in the RX 110. Such mismatches may degrade the IRR, the SINR, and/or the SImR of the RX 110 (e.g., as discussed in detail below).

The filter 116a may be any appropriate filter, such as an analog, baseband, and/or low-pass filter. The filter 116a may receive, as an input, an output of the mixer 116c. The filter 116a may have an impulse response represented by $h_{IRX}(t)$. The filter 116b may be similar to the filter 116a, and may have any of the features, characteristics, structure, and/or functionality as the filter 116a. The filter 116b may receive, as an input, an output of the mixer 116d. The filter 116b may have an impulse response represented by $h_{QRX}(t)$. A mismatch between the impulse responses $h_{IRX}(t)$ and $h_{QRX}(t)$ ($h_{IRX}(t)\neq h_{QRX}(t)$) on the I and Q paths of the RX 110 may create frequency-dependent IQ mismatch (FD-IQMM). Such mismatches may degrade the IRR, the SINR, and/or the SImR of the RX 110 (e.g., as discussed in detail herein).

By way of example, a frequency response of the received baseband signal may be expressed as:

$$R(f)=G_{1RX}(f)Z_{RX}(f)+G_{2RX}(f)Z^*_{RX}(-f)+N_{RX}(f), \quad (6)$$

where $R(f)$ is the frequency response of the received baseband signal, $Z_{RX}(f)$ is a frequency response of the baseband equivalent of the received signal at the input of the mixers, $N_{RX}(f)$ is additive RX noise, and $G_{1RX}(f)$ and $G_{2RX}(f)$ are defined as $$G_{1RX}(f)=\frac{H_{IRX}(f)+g_{RX}e^{-j\phi_{RX}}H_{QRX}(f)}{2}, \quad (7)$$

$$G_{2RX}(f)=\frac{H_{IRX}(f)-g_{RX}e^{+j\phi_{RX}}H_{QRX}(f)}{2},$$

where $H_{IRX}(f)$ and $H_{QRX}(f)$ in (7) denote the frequency responses of in-phase filter 116a and quadrature filter 116b, respectively. The second term in (6) represents the interfering image signal due to RX IQMM.

The RX IQMC 112 may compensate for IQ mismatches, including the IQ mismatches discussed above. The RX IQMC 112 may include, for example, a CVC IQMC (e.g., the RX CVC IQMC 206 shown in FIG. 2D), or an RVC IQMC (e.g., the RX RVC IQMC 208 shown in FIG. 2E). The RX IQMC 112 may include one or more components, certain examples of which are described below at least in reference to FIG. 2D and FIG. 2E. Certain parameters of those components (or certain parameters of the IQMC itself) may be referred to herein as IQMC parameters, or IQMC coefficients. The present disclosure provides for determining, selecting, setting, and/or updating IQMC parameters for the RX IQMC 112 (e.g., using an iterative technique such as the IQMC parameter optimization method 300 shown in FIG. 3) such that an IRR, an SINR, and/or an SImR of the RX 110 is improved.

Referring now to FIGS. 2A-2E, certain IQMC configurations are described in accordance with certain embodiments. These devices, methods, and techniques disclosed herein are not necessarily limited to the specific IQMC configurations shown in FIGS. 2A-2E, and other IQMC configurations may be implemented as appropriate.

Figure 2A:
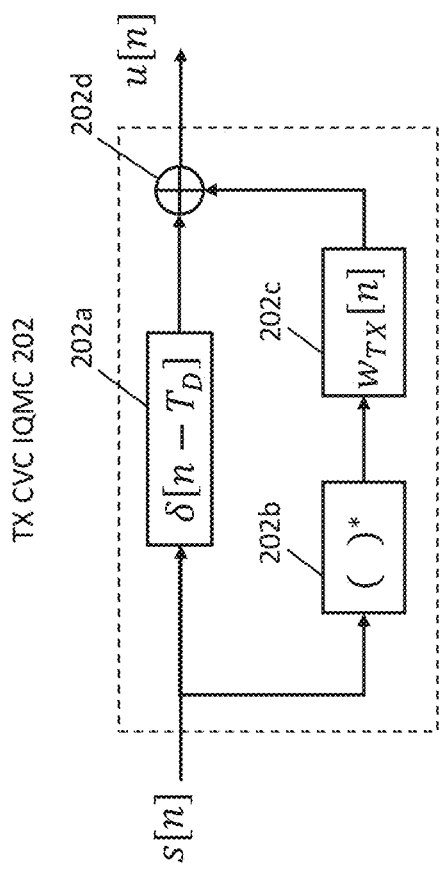
FIG. 2A shows a diagram of a complex valued pre-compensator (CVC) for a quadrature transmitter, according to some embodiments.

FIG. 2A shows a TX CVC IQMC 202, according to some embodiments. The TX CVC IQMC 202 (which may be referred to herein as an IQMC 202 for brevity) may include a delay component 202a configured to implement a delay of $T_D$, a complex-conjugate operator 202b, a complex-valued filter 202c (e.g., a finite impulse response (FIR) filter), and a signal aggregator 202d. The IQMC 202 may receive a signal s[n] (e.g., an in-phase signal $s_I[n]$ and/or a quadrature signal $s_Q[n]$ as shown in FIG. 1A). The received signal $s[n]=s_I[n]+js_Q[n]$ goes through the delay component 202a in a first path of the IQMC 202. In a second path of the IQMC 202, the received signal s[n] goes through the complex-conjugate operator 202b (which is configured to output the complex conjugate of an input) and then through the complex-valued filter 202c. The complex-valued filter 202c may have L tap weights $w_{TX,i}$, where i indexes the taps, and may have an impulse response $w_{TX}[n]=\sum_{i=0}^{L-1}w_{TX,i}\delta[n-i]$.

The outputs of both paths are aggregated (e.g., added) by the aggregator 202d, and the aggregator 202d outputs a compensated signal u[n]. The compensated signal u[n] may include the signal $u_I[n]$ and/or the signal $u_Q[n]$ shown in FIG. 1A.

The IQMC 202 may have certain IQMC parameters, including the L tap weights of the complex-valued filter 202c. The IQMC parameters of the IQMC 202 may be determined, configured and/or set using techniques described herein (e.g., the method shown in FIG. 3) to increase or maximize an IRR, and SINR, and/or an SImR of the TX 100 shown in FIG. 1A. Once the IQMC parameters are determined, the IQMC 202 can be configured to implement those parameters. Such implementation can be done at the time of manufacture or in the field, and in some embodiments, can be done dynamically (e.g., according to a maintenance schedule, or based on a condition of, or feedback from, a transmitter or transceiver that incorporates the IQMC 202).

The following provides an example of a general mathematical model for a signal in a TX 100 that is processed by a TX IQMC 102. The following will also apply this general mathematical model to certain example IQMCs, including the IQMC 202.

We can write the frequency response of the pre-compensated signal in the TX 100, U(f) (used above, e.g., in equation 2), as a function of a clean baseband signal using an IQMC, as follows:

$$U(f) = F_{1TX}(f)S(f) + F_{2TX}(f)S^*(-f), \quad (8)$$

where, $F_{1TX}(f)$ and $F_{2TX}(f)$ are a function of IQMC parameters and/or characteristics. By substituting equation 8 into equation 2, the baseband equivalent of the TX up-converted signal will be $$Z_{TX}(f) = S(f)(F_{1TX}(f)G_{1TX}(f) + F^*_{2TX}(-f)G_{2TX}(f)) + S^*(-f)(F_{2TX}(f)G_{1TX}(f) + F^*_{1TX}(-f)G_{2TX}(f)) + N_{TX}(f). \quad (9)$$

For the IQMC 202, $F_{1TX}(f) = e^{-j2\pi f T_D}$, and $F_{2TX}(f) = W_{TX}(f)$, where $W_{TX}(f)$ may denote the frequency response of filter $w_{TX}[n]$.

The following provides an example of a mathematical model for IRR in a TX 100. One example formula for modelling the IRR of a TX 100 is as follows:

$$IRR_{TX}(f) = \frac{|F_{1TX}(f)G_{1TX}(f) + F^*_{2TX}(-f)G_{2TX}(f)|^2}{|F_{2TX}(f)G_{1TX}(f) + F^*_{1TX}(-f)G_{2TX}(f)|^2}, \quad (10)$$

Using the above equation 10 for modelling the IRR of a TX 100, and the above expressions for $F_{1TX}(f)$ and $F_{2TX}(f)$ for the IQMC 202, one can mathematically model the IRR for the IQMC 202. Using techniques described herein, such an IRR can be optimized.

The following provides an example of a mathematical model for a signal-to-interference-plus-noise ratio (SINR) in a TX 100. One example formula for modelling the SINR of a TX 100 is as follows:

$$SINR_{TX}(f) = \frac{|F_{1TX}(f)G_{1TX}(f) + F^*_{2TX}(-f)G_{2TX}(f)|^2}{|F_{2TX}(f)G_{1TX}(f) + F^*_{1TX}(-f)G_{2TX}(f)|^2 + \sigma^2_{TX}}, \quad (11)$$

where $\sigma_{TX}^2$ is a normalized TX noise variance, e.g.

$$\sigma^2_{TX} = \frac{\mathbb{E}(|N_{TX}(f)|^2)}{\mathbb{E}(|S(f)|^2)}.$$

One can determine IQMC coefficients by maximizing or increasing SINR, which considers both IQMM and noise effects. When noise power is significant (e.g., comparable to that of the image signal level, or greater), maximizing SINR may provide significant improvement in terms of the system throughput.

In some of the above derivations, we assumed that $G_{1TX}(f)$, $G_{2TX}(f)$ at frequencies $f_1, \ldots, f_K$ are known (e.g., they are estimated by sending pilot signals at continuous time baseband frequencies $f_1, \ldots, f_K$). However, one might have estimates of the relative mismatches, and not have reasonable estimates of $G_{1TX}(f)$, $G_{2TX}(f)$ independently. The following provides some techniques that can be used when estimates of relative mismatches are known, even if one does not have reasonable estimates of $G_{1TX}(f)$, $G_{2TX}(f)$ independently.

Define the following parameter that is a function of gain and filter mismatches:

$$V_{TX}(f) \triangleq \frac{H_{ITX}(f)}{g_{TX}H_{QTX}(f)} \quad (12)$$

Given this, the IRR can be estimated as follows:

$$IRR_{TX}(f) = \quad (13)$$

$$\frac{|V_{TX}(f)e^{-j\phi_{TX}} + 1 + (V_{TX}(f)e^{-j\phi_{TX}} - 1)e^{+j2\pi f T_D}W^*_{TX}(-f)|^2}{|V_{TX}(f)e^{-j\phi_{TX}} - 1 + (V_{TX}(f)e^{-j\phi_{TX}} + 1)e^{+j2\pi f T_D}W_{TX}(f)|^2},$$

Figure 3:
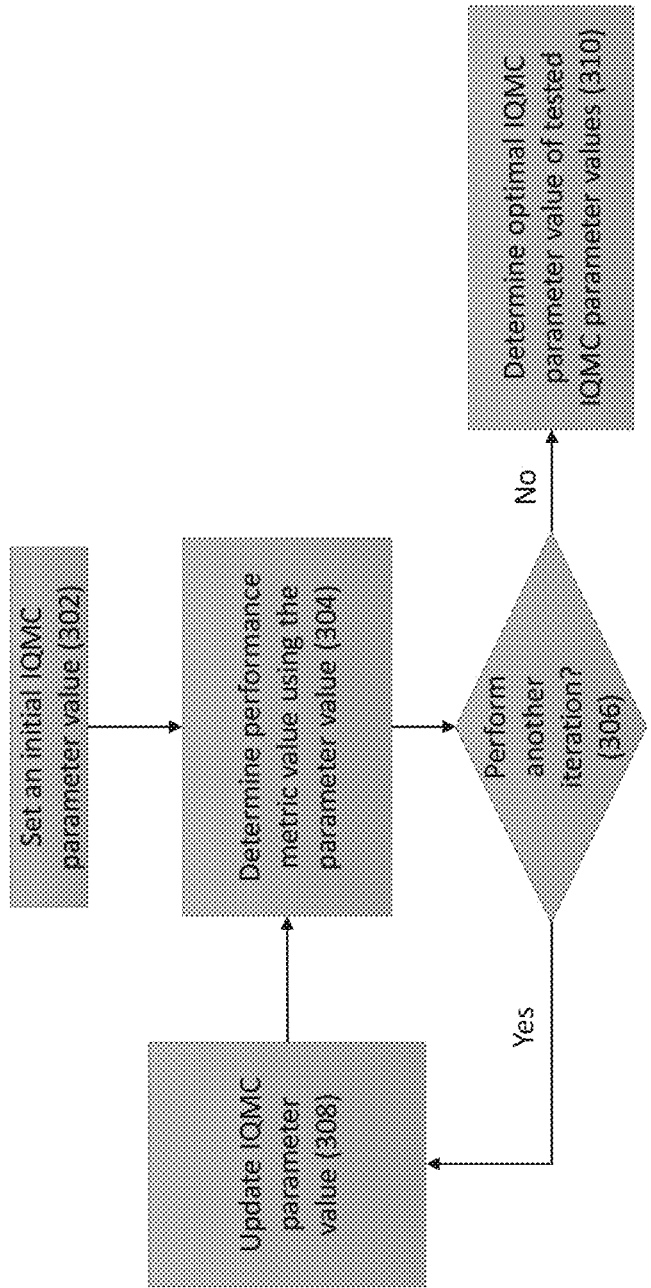
FIG. 3 shows a flowchart of an IQ mismatch compensator (IQMC) parameter optimization method, according to some embodiments.
Figure 4:
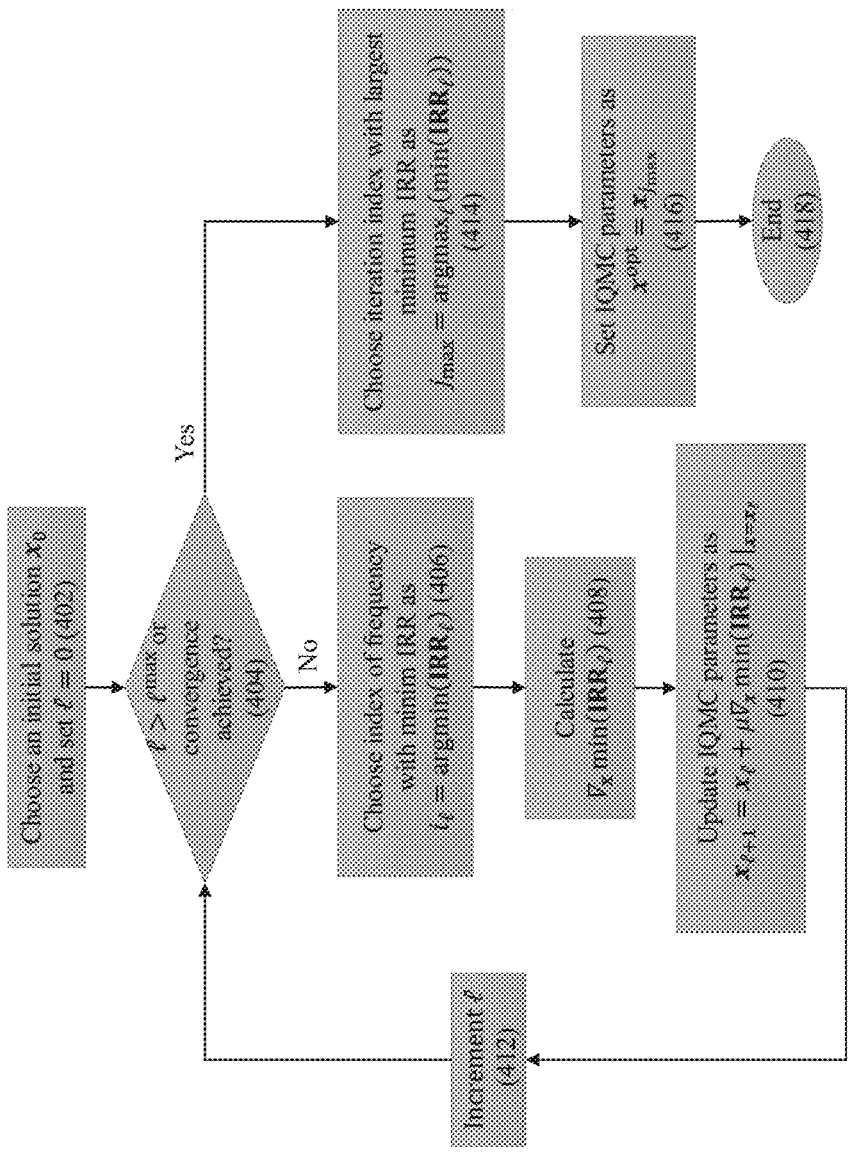
FIG. 4 shows a flowchart of an IQMC parameter optimization method, according to some embodiments.

Assuming that $\phi_{TX}$ and $V_{TX}(f)$ are known (e.g., estimated, such as by sending pilot signals at continuous time baseband frequencies $f_1, \ldots, f_K$), improved IQMC coefficients can be determined using iterative techniques described herein (e.g., in reference to FIGS. 3 and 4).

Some applications involve determining an SImR instead of, or in addition to, determining an IRR or an SINR. Like the IRR or the SINR, the SImR may be indicative of a performance or quality of a TX IQMC. One example manner of expressing SImR for a TX is as follows:

$$SImR_{TX}(f) = \frac{|F_{1TX}(f)G_{1TX}(f) + F^*_{2TX}(-f)G_{2TX}(f)|^2}{|F_{2TX}(-f)G_{1TX}(-f) + F^*_{1TX}(f)G_{2TX}(-f)|^2}. \quad (14)$$

Techniques presented herein can be used to determine and/or implement IQMC parameters, such as the tap weights that define $w_{TX}[n]$ (tap weights of the complex-valued filter 202c) or that define $W_{TX}(f)$ (a frequency domain response or Fourier transform (e.g., fast Fourier transform or other Fourier transform) of $w_{TX}[n]$), that improve, increase, or maximize IRR, SINR, or SImR.

Figure 2B:
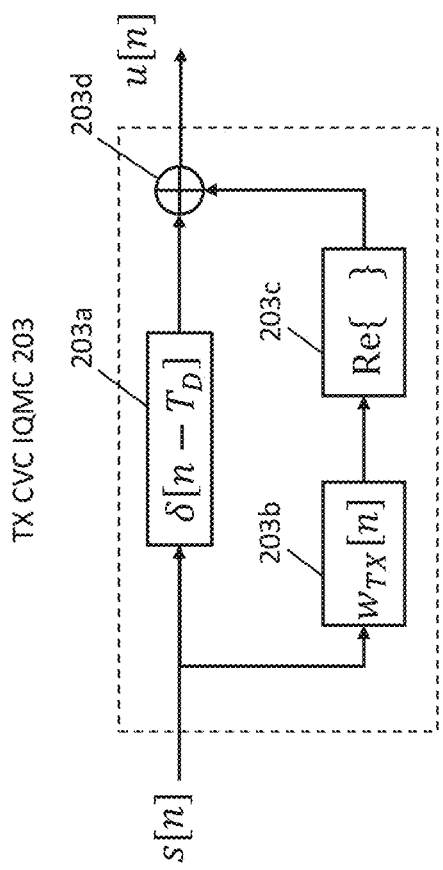
FIG. 2B shows a diagram of a complex valued pre-compensator (CVC) for a quadrature transmitter, according to some embodiments.

FIG. 2B shows a TX CVC IQMC 203, according to some embodiments. The TX CVC IQMC 203 may be referred to herein as an IQMC 203, for brevity. The IQMC 203 may include a delay component 203a configured to implement a delay of $T_D$, a complex-valued filter 203b (e.g., a finite impulse response (FIR) filter), a real-value operator 203c (configured to pass a real value portion of a signal, and block an imaginary portion of a signal), and a signal aggregator 203d. The IQMC 203 may receive a signal s[n] (e.g., an in-phase signal $s_I[n]$ and/or a quadrature signal $s_Q[n]$ as shown in FIG. 1A). The received signal $s[n]=s_I[n]+js_Q[n]$ goes through the delay component 203a in a first path of the IQMC 203. In a second path of the IQMC 203, the received signal s[n] goes through the complex-valued filter 203b. The complex-valued filter 203b may have L tap weights $w_{TX,i}$, where i indexes the taps, and may have an impulse response $w_{TX}[n] = \sum_{i=0}^{L-1} w_{RX,i}\delta[n-i]$. The output of the complex-valued filter 203b is sent to the real-value operator 203c, which passes a real value component of the signal to the aggregator 203d and blocks an imaginary component of the signal. The outputs of both paths are aggregated (e.g., added) by the aggregator 203d, and the aggregator 203d outputs a compensated signal u[n]. The compensated signal u[n] may include the signal $s_I[n]$ and/or the signal $s_Q[n]$ shown in FIG. 1A.

The IQMC 203 may have certain IQMC parameters, including the L tap weights of the complex-valued filter 203b. The IQMC parameters of the IQMC 203 may be determined, configured and/or set using techniques described herein (e.g., the method shown in FIG. 3) to increase or maximize an IRR, and SINR, and/or an SImR of the TX 100 shown in FIG. 1A. Once the IQMC parameters are determined, the IQMC 203 can be configured to implement those parameters. Such implementation can be done at the time of manufacture or in the field, and in some embodiments, can be done dynamically (e.g., according to a maintenance schedule, or based on a condition of, or feedback from, a transmitter or transceiver that incorporates the IQMC 203).

Referring to equations 8 and 9, for the IQMC 203, $$F_{1TX}(f) = e^{-j2\pi f T_D} + \frac{W_{TX}(f)}{2}, \text{ and}$$

$$F_{2TX}(f) = \frac{W_{TX}^*(-f)}{2},$$

where $W_{TX}(f)$ may denote the frequency response of filter $w_{TX}[n]$. This, in combination with equation 10, provides an example of a mathematical model for IRR for a TX 100 that includes the IQMC 203. Additionally, this, in combination with equation 11, provides an example of a mathematical model for SINR for a TX 100 that includes the IQMC 203. Additionally, the above expressions for $F_{1TX}(f)$ and $F_{2TX}(f)$ in combination with equation 14 provides an example of a mathematical model for SImR for a TX 100 that includes the IQMC 203.

Given the above, the following provides an example of a mathematical model for IRR in a TX 100 that includes the IQMC 203 (where $V_{TX}(f)$ is defined as in equation 12):

$$IRR_{TX}(f) = \frac{\left|1 + \frac{e^{+j\phi_{TX}}}{V_{TX}(f)} + e^{+j2\pi f T_D} W_{TX}(f)\right|^2}{\left|1 - \frac{e^{+j\phi_{TX}}}{V_{TX}(f)} + e^{+j2\pi f T_D} W_{TX}^*(-f)\right|^2}. \quad (15)$$

Techniques presented herein can be used to determine and/or implement IQMC parameters, such as the tap weights that define $w_{TX}[n]$ or the tap weights that define $W_{TX}(f)$ (a frequency domain response or Fourier transform (e.g., fast Fourier transform or other Fourier transform) of $w_{TX}[n]$), that improve, increase, or maximize the IRR, the SINR, and/or the SImR.

Figure 2C:
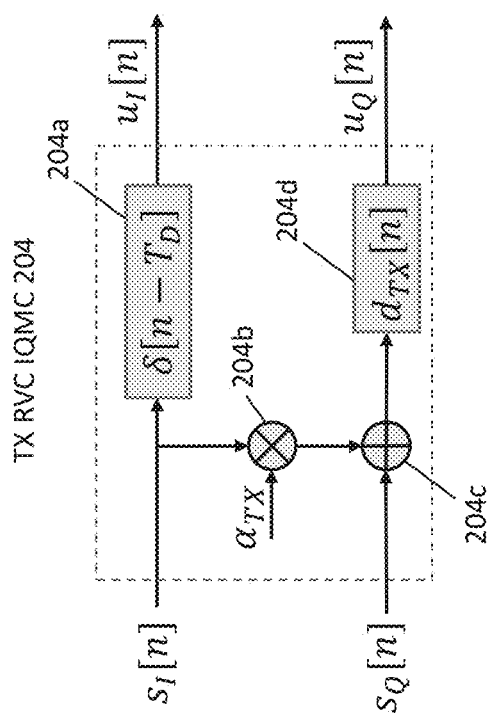
FIG. 2C shows a diagram of a real valued pre-compensator (RVC) for a quadrature transmitter, according to some embodiments.

FIG. 2C shows a TX RVC IQMC 204, according to some embodiments. The TX RVC IQMC 204 may be referred to herein as an IQMC 204, for brevity. The IQMC 204 shown in FIG. 2C may include a delay component 204a configured to provide a delay $T_D$, a multiplier 204b configure to multiply at least one input based on a multiplication factor, an aggregator 204c configured to aggregate (e.g., add) at least two inputs, and a real-valued filter 204d (e.g., a FIR filter). The delay component 204a may receive a digitized input signal $s_I[n]$, and may introduce a delay $T_D$ to generate a compensated signal $u_I[n]$. The input signal $s_I[n]$ may be input to the multiplier 204b, which multiplies the input signal $s_I[n]$ based on a real-valued cross-multiplication factor $\alpha_{TX}$ that is input to the multiplier 204b. The multiplied signal is input to the aggregator 204c, and an input signal $s_Q[n]$ is also input to the aggregator 204c. The aggregator 204c aggregates (e.g., adds) the multiplied signal and the input signal $s_Q[n]$, and outputs the resultant signal to the real-valued filter 204d. The real-valued filter 204d may have L tap weights $d_{TX,i}$, where i indexes the taps, and may have an impulse response $d_{TX,i}[n]=\Sigma_{i=0}^{L-1}d_{TX,i}\delta[n-i]$. The real-valued filter 204d outputs a compensated signal $u_Q[n]$.

The IQMC 204 may have certain IQMC parameters, including the real-valued cross-multiplication factor $\alpha_{TX}$ that is input to the multiplier 204b, and the L tap weights of the real-valued filter 204d. The IQMC parameters of the IQMC 204 may be determined, configured and/or set using techniques described herein (e.g., the method shown in FIG. 3) to increase or maximize an IRR, an SINR, and/or an SImR of the TX 100 shown in FIG. 1A. Once the IQMC parameters are determined, the IQMC 204 can be configured to implement those parameters. Such implementation can be done at the time of manufacture or in the field, and in some embodiments, can be done dynamically (e.g., according to a maintenance schedule, or based on a condition of, or feedback from, a transmitter or transceiver that incorporates the IQMC 204).

Referring to equations 8 and 9, for the IQMC 204, $$F_{1TX}(f) = \frac{e^{-j2\pi f T_D}}{2} + \frac{D_{TX}(f)(1 + j\alpha_{TX})}{2}, \text{ and}$$

$$F_{2TX}(f) = \frac{e^{-j2\pi f T_D}}{2} - \frac{D_{TX}(f)(1 - j\alpha_{TX})}{2},$$

where $D_{TX}(f)$ may denote the frequency response of filter $d_{TX}[n]$. This, in combination with equation 10, provides an example of a mathematical model for IRR for a TX 100 that includes the IQMC 204. Additionally, this, in combination with equation 11, provides an example of a mathematical model for SINR for a TX 100 that includes the IQMC 204. Additionally, the above expressions for $F_{1TX}(f)$ and $F_{2TX}(f)$ in combination with equation 14 provides an example of a mathematical model for SImR for a TX 100 that includes the IQMC 204.

Furthermore, the following provides an example of a mathematical model for IRR in a TX 100 that includes the IQMC 204 (where $V_{TX}(f)$ is defined as in equation 12):

$$IRR_{TX}(f) = \frac{|V_{TX}(f)e^{-j\phi_{TX}} + e^{+j2\pi f T_D} D_{TX}(f)(j\alpha_{TX} + 1)|^2}{|V_{TX}(f)e^{-j\phi_{TX}} + e^{+j2\pi f T_D} D_{TX}(f)(j\alpha_{TX} - 1)|^2}. \quad (16)$$

Techniques presented herein can be used to determine and/or implement IQMC parameters, such as the tap weights that define $d_{TX}[n]$ or the tap weights that define $D_{TX}(f)$ (a frequency domain response or Fourier transform (e.g., fast Fourier transform or other Fourier transform) of $d_{TX}[n]$), and/or $\alpha_{TX}$, that improve, increase, or maximize the IRR, the SINR, and/or the SImR.

Figure 2D:
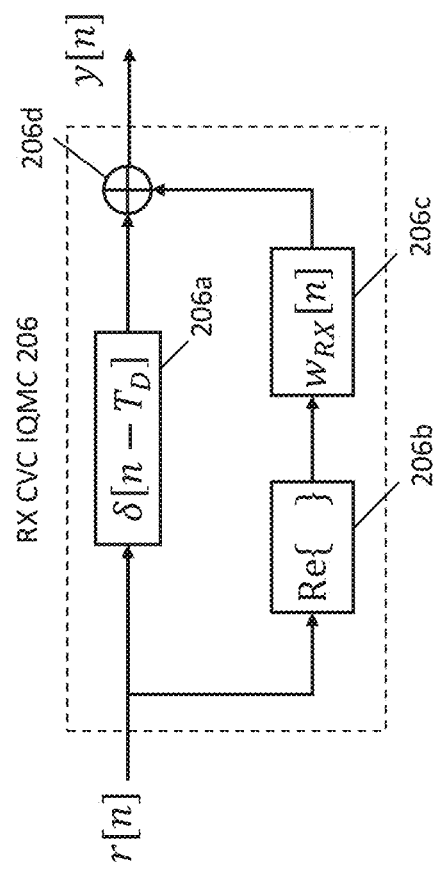
FIG. 2D shows a diagram of a complex valued compensator (CVC) for a quadrature receiver, according to some embodiments.

FIG. 2D shows an RX CVC IQMC 206, according to some embodiments. The RX CVC IQMC 206 may be referred to herein as an IQMC 206, for brevity. The IQMC 206 may include a delay component 206a configured to implement a delay of $T_D$, a real-value operator 206b (configured to pass a real value portion of a signal, and block an imaginary portion of a signal), a complex-valued filter 206c (e.g., a finite impulse response (FIR) filter), and a signal aggregator 206d. The IQMC 206 may receive a signal r[n] (e.g., an in-phase signal $r_I[n]$ and/or a quadrature signal $r_Q[n]$ as shown in FIG. 1B). The received signal $r[n]=r_I[n]+jr_Q[n]$ goes through the delay component 206a in a first path of the IQMC 206. In a second path of the IQMC 206, the received signal r[n] goes through the real-value operator 206b, which passes a real value component of an input signal and blocks an imaginary component of the input signal. The output of the real-value operator 206b is then sent to the complex-valued filter 206c. The complex-valued filter 206c may have L tap weights $w_{RX,i}$, where i indexes the taps, and may have an impulse response $w_{RX}[n]=\Sigma_{i=0}^{L-1}w_{RX,i}\delta[n-i]$. The outputs of both paths are aggregated (e.g., added) by the aggregator 206d, and the aggregator 206d outputs a compensated signal y[n]. The compensated signal y[n] may include the signal $y_I[n]$ and/or the signal $y_Q[n]$ shown in FIG. 1B.

The IQMC 206 may have certain IQMC parameters, including the L tap weights of the complex-valued filter 206c. The IQMC parameters of the IQMC 206 may be determined, configured and/or set using techniques described herein (e.g., the method shown in FIG. 3) to increase or maximize an IRR, and SINR, and/or an SImR of the RX 200 shown in FIG. 1B. Once the IQMC parameters are determined, the IQMC 206 can be configured to implement those parameters. Such implementation can be done at the time of manufacture or in the field, and in some embodiments, can be done dynamically (e.g., according to a maintenance schedule, or based on a condition of, or feedback from, a receiver or transceiver that incorporates the IQMC 206).

The following provides an example of a general mathematical model for a signal in an RX 110 that is processed by an RX IQMC 112. The following will also apply this general mathematical model to certain example IQMCs, including the IQMC 206.

We can write the frequency response of the compensated signal in the RX 110, using an IQMC, as follows:

$$Y(f)=F_{1RX}(f)R(f)+F_{2RX}(f)R^*(-f). \quad (17)$$

where, $F_{1RX}(f)$ and $F_{2RX}(f)$ are a function of IQMC parameters and/or characteristics. By using equation 17 and equation 6, the compensated RX signal will be $$Y(f)=Z_{RX}(f)(F_{1RX}(f)G_{1RX}(f)+F_{2RX}(f)G^*_{RX}(-f))+Z^*_{RX}(-f)(F_{1RX}(f)G_{2RX}(f)+F_{2RX}(f)G^*_{1RX}(-f))+F_{1RX}(f)N_{RX}+F_{2RX}(f)N^*_{RX}(-f), \quad (18).$$

For the IQMC 206, $$F_{1RX}(f) = e^{-j2\pi f T_D} + \frac{W_{RX}(f)}{2}, \text{ and } F_{2RX}(f) = \frac{W_{RX}(f)}{2}, \quad (45)$$

where $W_{RX}(f)$ may denote the frequency response of filter $w_{RX}[n]$.

The following provides an example of a mathematical model for IRR in an RX 110. One example formula for modelling the IRR of an RX 110 is as follows:

$$IRR_{RX}(f) = \frac{|F_{1RX}(f)G_{1RX}(f) + F_{2RX}(f)G^*_{2RX}(-f)|^2}{|F_{1RX}(f)G_{2RX}(f) + F_{2RX}(f)G^*_{1RX}(-f)|^2}, \quad (19)$$

Using the above equation 19 for modelling the IRR of an RX 110, and the above expressions for $F_{1TX}(f)$ and $F_{2TX}(f)$ for the IQMC 206, one can mathematically model the IRR for the IQMC 206. Using techniques described herein, such an IRR can be optimized.

The following provides an example of a mathematical model for a signal-to-interference-plus-noise ratio (SINR) in an RX 110. One example formula for modelling the SINR of an RX 110 is as follows:

$$SINR_{RX}(f) = \frac{|F_{1RX}(f)G_{1RX}(f) + F_{2RX}(f)G^*_{2RX}(-f)|^2}{|F_{1RX}(f)G_{2RX}(f) + F_{2RX}(f)G^*_{1RX}(-f)|^2 + \sigma^2_{RX}(|F_{1RX}(f)|^2 + |F_{2RX}(f)|^2)}, \quad (20)$$

where $\sigma_{RX}^2$ is a normalized RX noise variance, e.g.

$$\sigma_{RX}^2 = \frac{\mathbb{E}(|N_{RX}(f)|^2)}{\mathbb{E}(|Z_{RX}(f)|^2)}.$$

One can determine IQMC coefficients by maximizing or increasing SINR, which considers both IQMM and noise effects. When noise power is significant (e.g., comparable to that of the image signal level, or greater), maximizing SINR may provide significant improvement in terms of the system throughput. Using the above formula 20 in combination with the above expressions for $F_{1RX}(f)$ and $F_{2RX}(f)$ for the IQMC 206, one can mathematically model the SINR for the RX 110 having the IQMC 206.

In some of the above derivations, we assumed that $G_{1RX}(f)$, $G_{2RX}(f)$ at frequencies $f_1, \ldots, f_K$ are known (e.g., they are estimated by sending pilot signals at continuous time baseband frequencies $f_1, \ldots, f_K$). However, one might have estimates of the relative mismatches, and not have reasonable estimates of $G_{1RX}(f)$, $G_{2RX}(f)$ independently. The following provides some techniques that can be used when estimates of relative mismatches are known, even if one does not have reasonable estimates of $G_{1RX}(f)$, $G_{2RX}(f)$ independently.

The following provides an example of a mathematical model for IRR in an RX 110. Define the following parameter that is a function of gain and filter mismatches:

$$V_{RX}(f) \triangleq \frac{H_{IRX}(f)}{g_{RX}H_{QRX}(f)} \quad (21)$$

One example formula for modelling the IRR of an RX 110 that includes the RX CVC IQMC 206 is as follows:

$$IRR_{RX}(f) = \frac{\left|1 + \frac{e^{-j\phi_{RX}}}{V_{RX}(f)} + e^{+j2\pi f T_D}W_{RX}(f)\right|^2}{\left|1 - \frac{e^{+j\phi_{RX}}}{V^*_{RX}(-f)} + e^{+j2\pi f T_D}W_{RX}(f)\right|^2}. \quad (22)$$

Some applications involve determining an SImR instead of, or in addition to, determining an IRR or an SINR. Like the IRR or the SINR, the SImR may be indicative of a performance or quality of an RX IQMC. One example manner of expressing SImR for an RX is as follows:

$$SImR_{RX}(f) = \frac{|F_{1RX}(f)G_{1RX}(f) + F_{2RX}(f)G^*_{2RX}(-f)|^2}{|F_{1RX}(-f)G_{2RX}(-f) + F_{2RX}(-f)G^*_{1RX}(f)|^2}, \quad (23)$$

Techniques presented herein can be used to determine and/or implement IQMC parameters, such as the tap weights that define $w_{RX}[n]$ (tap weights of the complex-valued filter 206c) or that define $W_{RX}(f)$ (a frequency domain response or Fourier transform (e.g., fast Fourier transform or other Fourier transform) of $w_{RX}[n]$), that improve, increase, or maximize the IRR, the SINR, and/or the SImR.

Figure 2E:
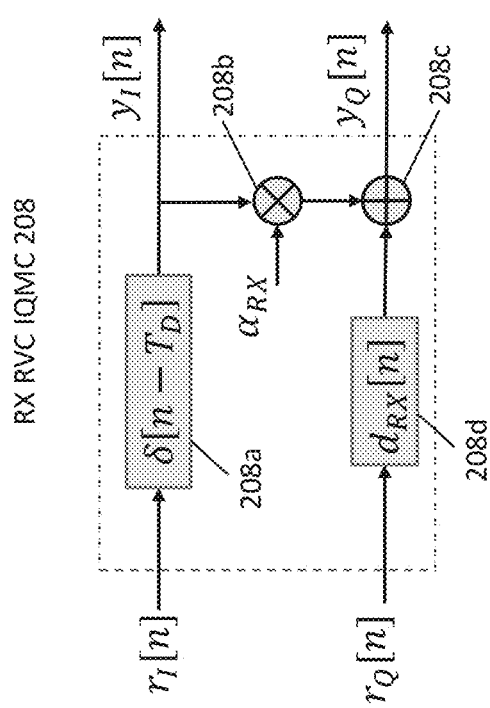
FIG. 2E shows a diagram of a real valued compensator (RVC) for a quadrature receiver, according to some embodiments.

FIG. 2E shows an RX RVC IQMC 208, according to some embodiments. The RX RVC IQMC 208 may be referred to herein as an IQMC 208, for brevity. The IQMC 208 shown in FIG. 2E may include a delay component 208a configured to provide a delay $T_D$, a multiplier 208b configure to multiply at least one input based on a multiplication factor, an aggregator 208c configured to aggregate (e.g., add) at least two inputs, and a real-valued filter 208d (e.g., a FIR filter). The delay component 208a may receive a digitized input signal $r_I[n]$, and may introduce a delay $T_D$ to generate a compensated signal $y_I[n]$. The compensated signal $y_I[n]$ may be input to the multiplier 208b, which multiplies the compensated signal $y_I[n]$ based on a real-valued cross-multiplication factor $\alpha_{RX}$ that is input to the multiplier 208b. The multiplied signal is input to the aggregator 208c. An input signal $r_Q[n]$ is input to the real-valued filter 208d. The real-valued filter 208d may have L tap weights $d_{TX,i}$, where i indexes the taps, and may have an impulse response $d_{RX,i}[n]=\Sigma_{i=0}^{L-1}d_{RX,i}\delta[n-i]$. The real-valued filter 208d outputs a filtered signal to the aggregator 208c. The aggregator 208c aggregates (e.g., adds) the multiplied signal and the filtered signal, and outputs the resultant signal $r_Q[n]$.

The IQMC 208 may have certain IQMC parameters, including the real-valued cross-multiplication factor $\alpha_{RX}$ that is input to the multiplier 208b, and the L tap weights of the real-valued filter 208d. The IQMC parameters of the IQMC 208 may be determined, configured and/or set using techniques described herein (e.g., the method shown in FIG. 3) to increase or maximize an IRR of the RX 110 shown in FIG. 1B. Once the IQMC parameters are determined, the IQMC 208 can be configured to implement those parameters. Such implementation can be done at the time of manufacture or in the field, and in some embodiments, can be done dynamically (e.g., according to a maintenance schedule, or based on a condition of, or feedback from, a receiver or transceiver that incorporates the IQMC 208).

For the IQMC 208, $$F_{1RX}(f) = \frac{e^{-j2\pi fT_D}(1+j\alpha_{RX})}{2} + \frac{D_{RX}(f)}{2}, \text{ and}$$

$$F_{2RX}(f) = \frac{e^{-j2\pi fT_D}(1+j\alpha_{RX})}{2} - \frac{D_{RX}(f)}{2},$$

where $D_{RX}(f)$ may denote the frequency response of filter $d_{RX}[n]$.

Using the above equation 19 for modelling the IRR of an RX 110, and the above expressions for $F_{1TX}(f)$ and $F_{2TX}(f)$ for the IQMC 208, one can mathematically model the IRR for the IQMC 208. Using techniques described herein, such an IRR can be optimized.

In some of the above derivations, we assumed that $G_{1RX}(f)$, $G_{2RX}(f)$ at frequencies $f_1, \ldots, f_K$ are known (e.g., they are estimated by sending pilot signals at continuous time baseband frequencies $f_1, \ldots, f_K$). However, one might have estimates of the relative mismatches, and not have reasonable estimates of $G_{1RX}(f)$, $G_{2RX}(f)$ independently. The following provides some techniques that can be used when estimates of relative mismatches are known, even if one does not have reasonable estimates of $G_{1RX}(f)$, $G_{2RX}(f)$ independently.

The following provides an example of a mathematical model for IRR in an RX 110. One example formula for modelling the IRR of an RX 110 that includes the RX RVC IQMC 208 is as follows (where $V_{RX}(f)$ is defined as in equation 21):

$$IRR_{RX}(f) = \frac{\left| V_{RX}(f)e^{+j\phi_{RX}} + e^{+j2\pi fT_D}\frac{D_{RX}(f)}{j\alpha_{RX}+1} \right|^2}{\left| V_{RX}^*(-f)e^{-j\phi_{RX}} - e^{+j2\pi fT_D}\frac{D_{RX}(f)}{j\alpha_{RX}+1} \right|^2}. \quad (24)$$

Techniques presented herein can be used to determine and/or implement IQMC parameters, such as the tap weights that define $d_{RX}[n]$ (tap weights of the real-value filter 208d) or the tap weights that define $D_{RX}(f)$ (a frequency domain response or Fourier transform (e.g., fast Fourier transform or other Fourier transform) of $d_{RX}[n]$), and/or $\alpha_{RX}$, that improve, increase, or maximize IRR.

Furthermore, one can mathematically model the SINR for the RX 110 having the IQMC 208, using the formula 20 in combination with the above expressions for $F_{1RX}(f)$ and $F_{2RX}(f)$ for the IQMC 208.

Additionally, some applications involve determining an SImR instead of, or in addition to, determining an IRR or an SINR. Like the IRR or the SINR, the SImR may be indicative of a performance or quality of an RX IQMC. One example manner of expressing SImR for an RX is as shown in Equation 23. Using that equation, and the above expressions for $F_{1TX}(f)$ and $F_{2TX}(f)$ for the IQMC 208, one can mathematically model the SImR of the RX that includes the IQMC 208.

FIG. 3 shows an IQMC parameter optimization method 300, according to some embodiments. The IQMC parameter optimization method 300 can be performed by a computing device that includes a communication device, such as a device that includes a TX and/or an RX, or that includes an IQMC compensator being optimized or tested. The IQMC parameter optimization method 300 can also be performed by a computing device that does not include the IQMC compensator being optimized or tested.

As a brief overview, the depicted IQMC parameter optimization method 300 includes setting an initial IQMC parameter value (302), determining a performance metric value using the IQMC parameter value (304), and determining whether to perform another iteration (306). If at operation (306) the computing device determines to perform another iteration, the IQMC parameter optimization method 300 proceeds to operation (308) which includes updating the IQMC parameter value, and returning to operation (304). Otherwise, the IQMC parameter optimization method 300 proceeds to determining an optimal IQMC parameter value of a set of tested IQMC parameter values (310).

The IQMC parameter optimization method 300 is an iterative technique that provides for determining IQMC parameters that increase or maximize a performance metric, such an IRR, a SINR, and/or an SImR of a TX or RX chain. The iterative technique can include, for example, a gradient ascent or gradient descent technique (such as that the example shown in FIG. 4), or another appropriate iterative technique, such as a Newton's Method technique.

Generally speaking, IRR, SINR, and SImR can be frequency-dependent, and the techniques described herein may be implemented to determine or set IQMC parameters that increase or maximize an IRR, SINR, or SImR of a TX or RX chain for a particular frequency, for a particular set of frequencies, and/or for a function of one or more frequencies (e.g., an average IRR, SINR, or SImR over a set of frequencies). For example, the techniques may be used to determine or set IQMC parameters that increase or maximize a lowest IRR of a set of IRRs that correspond to a set of frequencies of interest, such as the frequencies of a particular channel being used by the TX, RX, or transceiver. The lowest IRR is often (but not always) found at edges of a channel rather than in a middle portion of the channel (e.g., at an edge corresponding to 5% or less, 10% or less, or 15% or less of a total frequency band of the channel), and the IQMC parameters may be selected to increase or maximize an IRR of one or more frequencies corresponding to such an edge. In other embodiments, a different criteria may be used to select an IRR (corresponding to a particular frequency) to be increased or maximized. For example, the iterative technique may be used to determine or set IQMC parameters that increase or maximize a minimum geometric mean of IRR per component carrier (CC) in a carrier aggregation (CA) scheme. SINR and SImR can be optimized in a similar manner as described above for IRR.

In FIG. 3, at operation 302, the computing device sets an initial IQMC parameter value. The IQMC parameter value may be any appropriate IQMC parameter value for any appropriate IQMC parameter, including any of the IQMC parameters discussed herein, such as tap weights for a filter of a TX or RX IQMC and/or a real-valued cross-multiplication factor (e.g., when optimizing IQMC parameters for an RVC). The initial IQMC parameter value can be selected in any appropriate manner, such as, for example, by optimizing on the assumption of no IQMM.

At operation 304, the computing device determines a performance metric value using at least one candidate parameter value (e.g., using the initial IQMC parameter value or using an updated IQMC parameter value). Note that in some embodiments, a candidate parameter value is selected for one IQMC parameter, and in other embodiments, a respective candidate parameter value is selected for each of a plurality of IQMC parameters. The performance metric can include an IRR, and SINR, and/or an SImR for a communication device that includes the IQMC compensator for which at least one parameter is being optimized. The performance metric value can be estimated using a real or simulated IQMC compensator that implements or utilizes the candidate parameter value.

In some embodiments, the IQMC parameter optimization method 300 is an iterative gradient ascent or gradient descent method, and at (304) the computing device determines a performance metric value and a gradient of the performance metric using the IQMC parameters. The performance metric value can be calculated, for example, as described herein. Certain values, such as $F_{1TX/RX}(f)$ and $F_{2TX/RX}(f)$ or $\phi_{TX/RX}$ and $V_{TX/RX}(f)$ that may be used in calculating the performance metric values, are IQMM parameters at TX and RX chains that may be known apriori or may be estimated, for example, by sending pilot signals (e.g., at continuous time baseband frequencies$\pm f_1, \ldots, \pm f_K$) through the chain, and using recorded results of such propagation to estimate $F_{1TX/RX}(f)$ and $F_{2TX/RX}(f)$ or $\phi_{TX/RX}$ and $V_{TX/RX}(f)$. In some embodiments one may assume that one already has estimates of $F_{1TX/RX}(f)$ and $F_{2TX/RX}(f)$ or $\phi_{TX/RX}$ and $V_{TX/RX}(f)$ at frequencies$\pm f_1, \ldots, \pm f_K$, and can use them to obtain IQMC parameter values.

The gradient of the performance metric can be calculated using any appropriate technique, such as the technique described below with respect to FIG. 4. In some embodiments, an iterative technique is used to determine or set IQMC parameter values that optimize a minimum geometric mean of IRR per CC in a CA scheme, and a calculation of the gradient may include converting the performance metric to a logarithmic scale and using a regular mean.

At operation 306, the computing device determines whether to perform another iteration. This determination may be based on, for example, a timeout period expiring, a predetermined number of iterations being reached, a loss (in embodiments that use a loss function) of an iteration being at or below a predetermined threshold, a performance metric value of an iteration being calculated to be at or above a predetermined threshold (e.g., being at or above a performance metric value for another frequency in the channel or set of frequencies of interest), or a combination thereof. Other criteria may also be included in the determination of whether to perform another iteration, as appropriate. If the computing device determines to perform another iteration, the method proceeds to operation 308. If the computing device determines not to perform another iteration, the method proceeds to operation 310.

At operation 308, the computing device updates the IQMC candidate parameter value. The computing device may update the IQMC candidate parameter value using the current IQMC candidate parameter value, using the performance metric value calculated in operation 304, using multiple previous IQMC candidate parameter values, using a change in the performance metric values calculated for the multiple previous IQMC candidate parameter values, or in any other appropriate manner. For example, in some embodiments, a gradient ascent method is implemented, and as described below with respect to FIG. 4, one or more IQMC parameter values are changed in a direction of gradient. These updated parameters are then used at operation 304 in a next iteration of the IQMC parameter optimization method 300.

At operation 310, one or more optimal, high performing, or best performing IQMC parameter values of a set of tested IQMC candidate parameter values (e.g., a set of IQMC candidate parameter values used in at least one iteration of the IQMC parameter optimization method 300) are identified, determined, or selected, and may be implemented in an IQMC (e.g., the IQMC may be adjusted to implement the optimal IQMC parameter values). Thus, an IQMC is implemented using optimized IQMC parameters that increase or maximize an IRR of the TX or RX chain. Such an improved IRR can improve the performance of a device that incorporates or implements the TX or RX chain.

Referring now to FIG. 4, FIG. 4 shows an example of a gradient ascent (or gradient descent) approach to iteratively determining IQMC parameters that maximize or increase a lowest IRR of a set of IRRs that correspond to a set of frequencies of interest in a TX or RX chain. Although the depicted example method uses IRR as the IQMC performance metric, a similar method can be implemented using SINR and/or SImR.

As a general overview, the example IQMC parameter optimization method 400 shown in FIG. 4 includes choosing an initial solution (402), and determining whether additional iterations are appropriate (404). If additional iterations are determined to be appropriate at operation (404), the example IQMC parameter optimization method 400 proceeds to selecting a frequency corresponding to a minimum IRR of a set of IRRs of interest (406), determining a gradient (408), updating IQMC parameters using the gradient (410), increasing an iteration index or count (412), and returning to operation 404. If additional iterations are determined to be inappropriate at operation 404, the example IQMC parameter optimization method 400 proceeds to identifying an iteration index with a largest minimum IRR (414), and setting IQMC parameters that correspond to the iteration index identified in operation 414 (416). The process then ends (418).

The following provides some example mathematical framework and background that can be used in implementing the IQMC parameter optimization method 400. The following provides, among other things, tools for defining a performance metric in terms of one or more IQMC parameters, and a gradient of the performance metric with respect to the one or more IQMC parameters, which can be used in implementing the IQMC parameter optimization method 400.

Let x denote the vector of coefficients of IQMC block in TX or RX:

for RUC: $x=[\alpha_{TX/RX}, d_{TX/RX,0}, \ldots, d_{TX/RX,L-1}]^T$ (25); and a for CVC: $x=[\text{Re}\{w_{TX/RX,0}\}, \ldots, \text{Re}\{w_{TX/RX,L-1}\},$
$\text{Im}\{w_{TX/RX,0}\}, \ldots, \text{Im}\{w_{TX/RX,L-1}\}]^T$ (26).

In order to maximize IRR, one can formulate the problem as follows:

$$\max_{x} \mathcal{L}(x),$$

where the cost function $\mathcal{L}(x)$ depends on IQMC parameters x. For IRR maximization, cost function $\mathcal{L}$ is a function of $IRR_{TX/RX}(f)$ at the selected/measured continuous-time frequencies $f=f_1, \ldots, f_K$ over the desired frequency band. For SINR maximization, cost function $\mathcal{L}$ is a function of $SINR_{TX/RX}(f)$ at the selected/measured continuous-time frequencies $f=f_1, \ldots, f_K$ over the desired frequency band.

The optimization problem above can be solved, for example, using a gradient ascent (GA) search method (although other approaches can also be used) whose update rule at the $(\ell+1)$ iteration is given by:

$$x_{\ell+1} = x_\ell + \mu \nabla_x \mathcal{L}(x)|_{x=x_\ell},$$ (27)

where $\mu$ in Equation 27 denotes the step size, which can be a function of iteration index, and for a CVC:

$$\nabla_x \mathcal{L}(x) = \qquad (28)$$
$$\left[\frac{\partial \mathcal{L}(x)}{\partial \text{Re}\{x_0\}}, \ldots, \frac{\partial \mathcal{L}(x)}{\partial \text{Re}\{x_{L-1}\}}, \frac{\partial \mathcal{L}(x)}{\partial \text{Im}\{x_0\}}, \ldots, \frac{\partial \mathcal{L}(x)}{\partial \text{Im}\{x_{L-1}\}}\right]^T =$$
$$\left[\frac{\partial \mathcal{L}(x)}{\partial \text{Re}\{w_{TX/RX,0}\}}, \ldots, \frac{\partial \mathcal{L}(x)}{\partial \text{Re}\{w_{TX/RX,L-1}\}}, \frac{\partial \mathcal{L}(x)}{\partial \text{Im}\{w_{TX/RX,0}\}}, \ldots, \frac{\partial \mathcal{L}(x)}{\partial \text{Im}\{w_{TX/RX,L-1}\}}\right]^T,$$

and for an RVC:

$$\nabla_x \mathcal{L}(x) = \left[\frac{\partial \mathcal{L}(x)}{\partial x_0}, \ldots, \frac{\partial \mathcal{L}(x)}{\partial x_L}\right]^T = \qquad (29)$$
$$\left[\frac{\partial \mathcal{L}(x)}{\partial \alpha_{TX/RX}}, \frac{\partial \mathcal{L}(x)}{\partial d_{TX/RX,0}}, \ldots, \frac{\partial \mathcal{L}(x)}{\partial d_{TX/RX,L-1}}\right]^T.$$

One can select a starting point $x_0$ as appropriate (e.g., one can use no-IQMC solutions). The iterations are continued until one reaches convergence or the maximum number of allowed iterations. One then sets IQMC coefficients to the ones that provide the optimized (largest, in this case) cost function over the iterations.

Let $S$ denote the set of desired continuous-time frequencies over the desired frequency band: $S = \{f_1, \ldots, f_K\}$. Some example cost functions for IRR maximization are:

$$\mathcal{L} = \min_{f \in S} IRR(f) \qquad (30)$$

minimum IRR over desired frequencies with $$\nabla_x \mathcal{L}(x) = \nabla_x \min_{f \in S} IRR(f);$$

$$\mathcal{L} = \frac{1}{|S|} \sum_{f \in S} IRR(f) \qquad (31)$$

mean of IRR over desired frequencies with $$\nabla_x \mathcal{L}(x) = \frac{1}{|S|} \sum_{f \in S} \nabla_x IRR(f);$$

$$\mathcal{L} = \left(\prod_{f \in S} IRR(f)\right)^{\frac{1}{|S|}} \qquad (32)$$

geometric mean of IRR over desired frequencies (note that gradient calculation for geometric mean can be simpler if one converts IRR to logarithmic scale and uses regular mean instead as the maximization in log domain is equivalent to the maximization in linear scale:

$$\nabla_x \ln \mathcal{L}(x) = \qquad (33)$$
$$\frac{1}{|S|} \sum_{f \in S} \frac{\nabla_x IRR(f)}{IRR(f)}; \text{ and } \mathcal{L} = \min_k \left(\prod_{f \in \mathcal{CC}_k} IRR(f)\right)^{\frac{1}{|\mathcal{CC}_k|}}$$

minimum geometric mean of IRR per CC in carrier aggregation scenarios, where $\mathcal{CC}_k$ is the set of selected frequencies that lie in the frequency range of the kth CC.

Some example cost functions for SINR maximization are:

$$\mathcal{L} = \min_{f \in S} SINR(f) \qquad (34)$$

minimum SINR over desired frequencies with $$\nabla_x \mathcal{L}(x) = \nabla_x \min_{f \in S} SINR(f);$$

and $$\mathcal{L} = \Sigma_{f \in S} \log_2(1+\text{SINR}(f)) \quad (35)$$

sum throughput over desired frequencies with $$\nabla_x \mathcal{L}(x) = \frac{1}{\ln 2} \sum_{f \in S} \frac{\nabla_x \text{SINR}(f)}{1+\text{SINR}(f)}.$$

In order to use Equations 30 through Equations 35 and calculate a gradient of $\mathcal{L}(x)$, one can assume that one already has estimates of $G_{1TX}(f), G_{2TX}(f)$ or $G_{1RX}(f), G_{2RX}(f)$ at frequencies $f_1, \ldots, f_K$ and use them to optimize the IQMC coefficients.

A gradient of IRR with respect to IQMC coefficients can be computed as $$\nabla_x \text{IRR}_{TX/RX}(f) = \frac{|J_2(f)|^2 \nabla_x(|J_1(f)|^2) - |J_1(f)|^2 \nabla_x(|J_2(f)|^2)}{|J_2(f)|^4}, \quad (36)$$

where $$J_1(f) = \begin{cases} F_{1TX}(f)G_{1TX}(f) + F_{2TX}^*(-f)G_{2TX}(f) & \text{for } TX \\ F_{1RX}(f)G_{1RX}(f) + F_{2RX}(f)G_{2RX}^*(-f) & \text{for } RX \end{cases}; \quad (37)$$

$$J_2(f) = \begin{cases} F_{2TX}(f)G_{1TX}(f) + F_{1TX}^*(-f)G_{2TX}(f) & \text{for } TX \\ F_{1RX}(f)G_{2RX}(f) + F_{2RX}(f)G_{1RX}^*(-f) & \text{for } RX \end{cases}; \text{ and} \quad (38)$$

$$\nabla_x(|J_1(f)|^2) = \begin{cases} 2\text{Re}\{(G_{1TX}(f) \times \nabla_x F_{1TX}(f) + \\ G_{2TX}(f) \times \nabla_x F_{2TX}^*(-f))J_1^*(f)\} & \text{for } TX \\ 2\text{Re}\{(G_{1RX}(f) \times \nabla_x F_{1RX}(f) + \\ G_{2RX}^*(-f) \times \nabla_x F_{2RX}(f))J_1^*(f)\} & \text{for } RX \end{cases}; \quad (39)$$

$$\nabla_x(|J_2(f)|^2) = \begin{cases} 2\text{Re}\{(G_{1TX}(f) \times \nabla_x F_{2TX}(f) + \\ G_{2TX}(f) \times \nabla_x F_{1TX}^*(-f))J_2^*(f)\} & \text{for } TX \\ 2\text{Re}\{(G_{2RX}(f) \times \nabla_x F_{1RX}(f) + \\ G_{1RX}^*(-f) \times \nabla_x F_{2RX}(f))J_2^*(f)\} & \text{for } RX \end{cases}. \quad (40)$$

Similarly, a gradient of SINR with respect to IQMC coefficients can be computed as:

$$\nabla_x \text{SINR}_{TX}(f) = \frac{(|J_2(f)|^2 + \sigma_{TX}^2)\nabla_x(|J_1(f)|^2) - |J_1(f)|^2 \nabla_x(|J_2(f)|^2)}{(|J_2(f)|^2 + \sigma_{TX}^2)^2}; \quad (41)$$

$$\nabla_x \text{SINR}_{RX}(f) = \frac{(|J_2(f)|^2 + \sigma_{RX}^2 J_3(f))\nabla_x(|J_1(f)|^2) - |J_1(f)|^2(\nabla_x(|J_2(f)|^2) + \sigma_{RX}^2 \nabla_x J_3(f))}{(|J_2(f)|^2 + \sigma_{RX}^2 J_3(f))^2}; \quad (42)$$

where (f), $J_1(f)$, $\nabla_x(|J_1(f)|^2)$, and $\nabla_x(|J_2(f)|^2)$ are defined in Eqs. 37-40, and $J_3(f)$ and its gradient are defined as:

$$J_3(f) = |F_{1RX}(f)|^2 + |F_{2RX}(f)|^2 \quad (43)$$

$$\nabla_x J_3(f) = 2\text{Re}\{F_{1RX}^*(f)\nabla_x F_{1RX}(f) + F_{2RX}^*(f)\nabla_x F_{2RX}(f)\} \quad (44).$$

Define $q_k^T = [1, e^{-j2\pi f_k/F_s}, \ldots, e^{-j2\pi f_k(L-1)/F_s}]$ as the DFT vector at continuous-time frequency $f_k$, where $F_s$ denotes sampling rate on which the IQMC operates. Suppose one uses FIR filters of length L IQMCs: $w_{1TX}[n] = \Sigma_{i=0}^{L-1} w_{1TX,i} \delta[n-i]$, $w_{2TX}[n] = \Sigma_{i=0}^{L-1} w_{2TX,i} \delta[n-i]$, $d_{TX}[n] = \Sigma_{i=0}^{L-1} d_{TX,i} \delta[n-i]$, $w_{RX}[n] = \Sigma_{i=0}^{L-1} w_{RX,i} \delta[n-i]$, and $d_{RX}[n] = \Sigma_{i=0}^{L-1} d_{RX,i} \delta[n-i]$ (where these five filter parameters respectively correspond to the IQMCs shown in FIGS. 2A-2E). Then, $\nabla_x F_{1TX}(f), \nabla_x F_{2TX}(f), \nabla_x F_{1RX}(f), \nabla_x F_{2RX}(f)$ for the IQMCs shown in FIGS. 2A-2E can be computed as:

For IQMC 202 with
$x = [\text{Re}\{w_{1TX,0}\}, \ldots, \text{Re}\{w_{1TX,L-1}\}, \text{Im}\{w_{1TX,0}\}, \ldots, \text{Im}\{w_{1TX,L-1}\}]^T$:

$$\frac{\partial F_{1TX}(f_k)}{\partial x_i} = \frac{\partial}{\partial x_i}\left(e^{-j2\pi \frac{f_k}{F_s} T_D}\right) = 0, i = 0, \ldots, 2L-1 \quad (45)$$

$$\frac{\partial F_{2TX}(f_k)}{\partial x_i} = \frac{\partial q_k^T w_{1,TX}}{\partial x_i} = \begin{cases} e^{-j2\pi i f_k/F_s} & i = 0, \ldots, L-1 \\ je^{-j2\pi(i-L)f_k/F_s} & i = L, \ldots, 2L-1 \end{cases}, \quad (46)$$

where $w_{1,TX} = [w_{1TX,0}, \ldots, w_{1TX,L-1}]^T$.

For IQMC 203 with
$x = [\text{Re}\{w_{2TX,0}\}, \ldots, \text{Re}\{w_{2TX,L-1}\}, \text{Im}\{w_{2TX,0}\}, \ldots, \text{Im}\{w_{2TX,L-1}\}]^T$:

$$\frac{\partial F_{1TX}(f_k)}{\partial x_i} = \quad (47)$$

$$\frac{\partial}{\partial x_i}\left(e^{-j2\pi \frac{f_k}{F_s} T_D} + \frac{q_k^T w_{2,TX}}{2}\right) = \begin{cases} \frac{e^{-j2\pi i f_k/F_s}}{2} & i = 0, \ldots, L-1 \\ \frac{e^{-j2\pi(i-L)f_k/F_s}}{2} & i = L, \ldots, 2L-1 \end{cases}$$

$$\frac{\partial F_{2TX}(f_k)}{\partial x_i} = \quad (48)$$

$$\frac{\partial}{\partial x_i}\left(\frac{q_k^T w_{2,TX}^*}{2}\right) = \begin{cases} \frac{e^{-j2\pi i f_k/F_s}}{2} & i = 0, \ldots, L-1 \\ -\frac{je^{-j2\pi(i-L)f_k/F_s}}{2} & i = L, \ldots, 2L-1 \end{cases},$$

where $w_{2,TX} = [w_{2TX,0}, \ldots, w_{2TX,L-1}]^T$.

For IQMC 204 with
$x = [\alpha, d_{TX}^T]^T = [\alpha, d_{TX,0}, \ldots, d_{TX,L-1}]^T$:

$$\frac{\partial F_{1TX}(f_k)}{\partial x_i} = \begin{cases} \frac{j}{2} q_k^T d_{TX} & i = 0 \\ \frac{(1+j\alpha_{TX})}{2} e^{-j2\pi(i-1)f_k/F_s} & i = 1, \ldots, L \end{cases} \quad (49)$$

$$\frac{\partial F_{2TX}(f_k)}{\partial x_i} = \begin{cases} \frac{j}{2} q_k^T d_{TX} & i = 0 \\ -\frac{(1-j\alpha_{TX})}{2} e^{-j2\pi(i-1)f_k/F_s} & i = 1, \ldots, L \end{cases}, \quad (50)$$

where $d_{TX} = [d_{TX,0}, \ldots, d_{TX,L-1}]^T$.

For IQMC 206 with
$x = [\text{Re}\{w_{RX,0}\}, \ldots, \text{Re}\{w_{RX,L-1}\}, \text{Im}\{w_{RX,0}\}, \ldots, \text{Im}\{w_{RX,L-1}\}]^T$:

-continued $$\frac{\partial F_{1RX}(f_k)}{\partial x_i} = \qquad (51)$$

$$\frac{\partial}{\partial x_i}\left(e^{-j2\pi\frac{f_k}{F_s}T_D} + \frac{q_k^T w_{RX}}{2}\right) = \begin{cases} \frac{e^{-j2\pi i f_k/F_s}}{2} & i = 0, \ldots, L-1 \\ \frac{je^{-j2\pi(i-L)f_k/F_s}}{2} & i = L, \ldots, 2L-1 \end{cases}$$

$$\frac{\partial F_{2RX}(f_k)}{\partial x_i} = \frac{\partial}{\partial x_i}\left(\frac{q_k^T w_{RX}}{2}\right) = \begin{cases} \frac{e^{-j2\pi i f_k/F_s}}{2} & i = 0, \ldots, L-1 \\ \frac{je^{-j2\pi(i-L)f_k/F_s}}{2} & i = L, \ldots, 2L-1 \end{cases} \qquad (52)$$

where $w_{RX} = [w_{RX,0}, \ldots, w_{RX,L-1}]^T$.

For *IQMC* 208 with
$x = [\alpha_{RX}, d_{RX}^T]^T = [\alpha_{RX}, d_{RX,0}, \ldots, d_{RX,L-1}]^T$:

$$\frac{\partial F_{1RX}(f_k)}{\partial x_i} = \begin{cases} \frac{j}{2}e^{-j2\pi\frac{f_k}{F_s}T_D} & i = 0 \\ \frac{1}{2}e^{-j2\pi(i-1)f_k/F_s} & i = 1, \ldots, L \end{cases} \qquad (53)$$

$$\frac{\partial F_{2RX}(f_k)}{\partial x_i} = \begin{cases} \frac{j}{2}e^{-j2\pi\frac{f_k}{F_s}T_D} & i = 0 \\ -\frac{1}{2}e^{-j2\pi(i-1)f_k/F_s} & i = 1, \ldots, L \end{cases} \qquad (54)$$

where $d_{RX} = [d_{RX,0}, \ldots, d_{RX,L-1}]^T$.

The equations immediately above provide some examples of mathematical modeling that can be appropriate when $G_{1TX}(f)$, $G_{2TX}(f)$ or $G_{1RX}(f)$, $G_{2RX}(f)$ at frequencies $f_1, \ldots, f_K$ are known (e.g., are estimated by sending pilot signals at continuous time baseband frequencies $f_1, \ldots, f_K$).

Equations 13, 15, 16, 22, and 24 provide some examples of mathematical modeling of IRR that can be used when $G_{1TX}(f)$, $G_{2TX}(f)$ or $G_{1RX}(f)$, $G_{2RX}(f)$ are not known separately and instead $V_{TX}(f)$ and $\phi_{TX}$ or $V_{RX}(f)$ and $\phi_{RX}$ are known (e.g., are estimated by sending pilot signals at continuous time baseband frequencies $f_1, \ldots, f_K$). The following provides some examples of mathematical modeling of gradients of cost functions that correspond to such IRR modelling.

To compute a gradient of such a cost function, $\nabla_x \mathcal{L}(x)$, for $$\mathcal{L} = \min_{f \in S} IRR(f),$$

one can let $$i_\ell = \underset{f \in S}{\arg\min}\, IRR(f)$$

denote the index of the frequency that has the smallest IRR value at the $\ell$ th iteration. Define $q_k^T = [1, e^{-j2\pi f_k/F_s}, \ldots, e^{-j2\pi f_k(L-1)/F_s}]$ as the DFT vector at continuous-time frequency $f_k$, where $F_s$ denotes a sampling rate on which IQMC operates. Then, a gradient of the cost function $$\mathcal{L} = \min_{f \in S} IRR(f)$$

with respect to RVC coefficients can be given by:
For TX RVCs:

$$\nabla_x \min_{f \in S} IRR(f) = \frac{|J_2(f_{i_\ell})|^2 \nabla_x(|J_1(f_{i_\ell})|^2) - |J_1(f_{i_\ell})|^2 \nabla_x(|J_2(f_{i_\ell})|^2)}{|J_2(f_{i_\ell})|^4}, \qquad (55)$$

where $$J_1(f_{i_\ell}) = V_{TX}(f_{i_\ell})e^{-j\phi_{TX}} + e^{+j2\pi\frac{f_{i_\ell}}{F_s}T_D} q_{i_\ell}^T d_{TX}(j\alpha_{TX} + 1),$$

$$J_2(f_{i_\ell}) = V_{TX}(f_{i_\ell})e^{-j\phi_{TX}} + e^{+j2\pi\frac{f_{i_\ell}}{F_s}T_D} q_{i_\ell}^T d_{TX}(j\alpha_{TX} - 1), \text{ and} \qquad (56)$$

$$\nabla_x(|J_1(f_{i_\ell})|^2) = 2\begin{bmatrix} \text{Im}\left\{J_1(f_{i_\ell})q_{i_\ell}^H d_{TX}e^{-j2\pi\frac{f_{i_\ell}}{F_s}T_D}\right\}, \\ \text{Re}\left\{J_1(f_{i_\ell})q_{i_\ell}^H(-j\alpha_{TX} + 1)e^{-j2\pi\frac{f_{i_\ell}}{F_s}T_D}\right\} \end{bmatrix}^T, \qquad (57)$$

$$\nabla_x(|J_2(f_{i_\ell})|^2) = 2\begin{bmatrix} \text{Im}\left\{J_2(f_{i_\ell})q_{i_\ell}^H d_{TX}e^{-j2\pi\frac{f_{i_\ell}}{F_s}T_D}\right\}, \\ \text{Re}\left\{J_2(f_{i_\ell})q_{i_\ell}^H(j\alpha_{TX} + 1)e^{-j2\pi\frac{f_{i_\ell}}{F_s}T_D}\right\} \end{bmatrix}^T.$$

For RX RVCs:

$$\nabla_x \min_{f \in S} IRR(f) = \frac{|J_2(f_{i_\ell})|^2 \nabla_x(|J_1(f_{i_\ell})|^2) - |J_1(f_{i_\ell})|^2 \nabla_x(|J_2(f_{i_\ell})|^2)}{|J_2(f_{i_\ell})|^4}, \qquad (58)$$

where $$J_1(f_{i_\ell}) = V_{RX}(f_{i_\ell})e^{+j\phi_{RX}} + e^{+j2\pi\frac{f_{i_\ell}}{F_s}T_D} \frac{q_{i_\ell}^T d_{RX}}{j\alpha_{RX} + 1},$$

$$J_2(f_{i_\ell}) = V_{RX}^*(-f_{i_\ell})e^{-j\phi_{RX}} + e^{+j2\pi\frac{f_{i_\ell}}{F_s}T_D} \frac{q_{i_\ell}^T d_{RX}}{j\alpha_{RX} + 1}, \text{ and} \qquad (57)$$

$$\nabla_x(|J_1(f_{i_\ell})|^2) = \qquad (59)$$

$$2\left[-\text{Im}\left\{\frac{J_1(f_{i_\ell})q_{i_\ell}^H d_{RX}}{(-j\alpha_{RX} + 1)^2}e^{-j2\pi\frac{f_{i_\ell}}{F_s}T_D}\right\}, \text{Re}\left\{\frac{J_1(f_{i_\ell})q_{i_\ell}^H}{-j\alpha_{RX} + 1}e^{-j2\pi\frac{f_{i_\ell}}{F_s}T_D}\right\}\right]^T,$$

$$\nabla_x(|J_2(f_{i_\ell})|^2) = $$

$$2\left[\text{Im}\left\{\frac{J_2(f_{i_\ell})q_{i_\ell}^H d_{RX}}{(-j\alpha_{RX} + 1)^2}e^{-j2\pi\frac{f_{i_\ell}}{F_s}T_D}\right\}, -\text{Re}\left\{\frac{J_2(f_{i_\ell})q_{i_\ell}^H}{-j\alpha_{RX} + 1}e^{-j2\pi\frac{f_{i_\ell}}{F_s}T_D}\right\}\right]^T.$$

One can follow similar steps and obtain the gradient for CVCs or other IQMC structures for other cost functions. The cost functions can be selected as appropriate to optimize a desired performance metric. For example, for SImR, using the formula shown in Equation 14 or in Equation 23, one can define any of the following example cost functions:

$$\mathcal{L} = \min_{f \in S} SImR(f):$$

minimum SImR over desired frequencies (frequencies of interest);

$$\mathcal{L} = \frac{1}{|S|}\Sigma_{f\in S} SImR(f);$$

mean of SImR over desired frequencies;

$$\mathcal{L} = \left(\prod_{f\in S} SImR(f)\right)^{\frac{1}{|S|}};$$

geometric mean of SImR over desired frequencies; and $$\mathcal{L} = \min_{k}\left(\prod_{f\in CC_k} SImR(f)\right)^{\frac{1}{|CC_k|}};$$

minimum geometric mean of SImR per component carrier (CC) in carrier aggregation (CA) scenarios.

With these example cost functions, one can compute a gradient for the SImR of choice using a similar framework as set forth above for IRR. Additionally, a particular IRR or SINR to optimize (that is, an IRR or an SINR corresponding to a particular frequency) may be made selected from a similar list as above, e.g., may be a minimum IRR or SINR over desired frequencies, may be a mean IRR or SINR over desired frequencies, may be a geometric mean IRR or SINR over desired frequencies, or may be a minimum geometric mean IRR or SINR per CC in CA scenarios. Optimization of other IRRs, SINRs, or SImRs (that is, IRRs, SINRs, or SImRs corresponding to different frequencies) may also be implemented, as appropriate, using techniques described herein.

Figure 5:
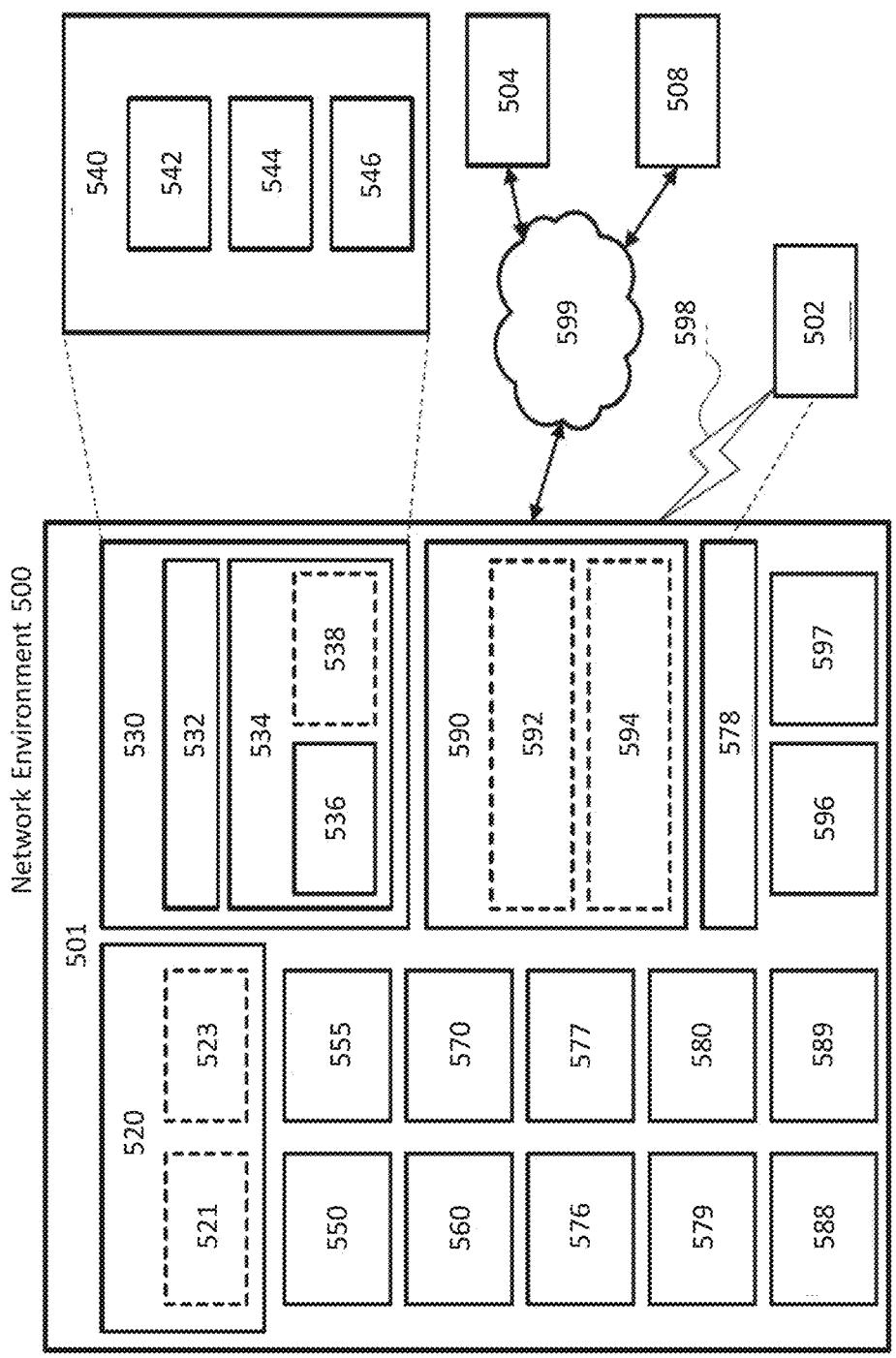
FIG. 5 shows a diagram of an electronic device in a network environment, according to some embodiments.

FIG. 5 shows a diagram of an electronic device 501 in a network environment 500, according to some embodiments. Referring to FIG. 5, the electronic device 501 in the network environment 500 may communicate with an electronic device 502 via a first network 598 (e.g., a short-range wireless communication network, such as a Wi-Fi network), or an electronic device 504 or a server 508 via a second network 599 (e.g., a long-range wireless communication network). The electronic device 501 may communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, and/or an antenna module 597. In one embodiment, at least one of the components (e.g., the display device 560 or the camera module 580) may be omitted from the electronic device 501, or one or more other components may be added to the electronic device 501. In one embodiment, some of the components may be implemented as a single integrated circuit (IC). For example, the sensor module 576 (e.g., a fingerprint sensor, an iris sensor, or an illuminance sensor) may be embedded in the display device 560 (e.g., a display), or the display device 560 may include one or more sensors in addition to the sensor module 576.

In some embodiments, the device 501 may include the TX 100 or the RX 110 (or both). The device 501 may include an IQMC, including at least one of the IQMCs shown in FIGS. 2A-2E. In some embodiments, the device 501 may include a computing device configured to implement an IQMC optimization technique, such as the IQMC parameter optimization method 300 shown in FIG. 3, or the IQMC parameter optimization method 400 shown in FIG. 4.

The processor 520 may execute, for example, software (e.g., a program 540) to control at least one other component (e.g., a hardware or a software component) of the electronic device 501 coupled with the processor 520, and may perform various data processing and/or computations. As at least a part of the data processing and/or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, and/or execute a particular function. The auxiliary processor 523 may be implemented as being separate from, or as a part of, the main processor 521.

The auxiliary processor 523 may control at least some of the functions or states related to at least one component (e.g., the display device 560, the sensor module 576, or the communication module 590) from among the components of the electronic device 501, instead of the main processor 521 while the main processor 521 is in an inactive (e.g., sleep) state, or together with the main processor 521 while the main processor 521 is in an active state (e.g., executing an application). According to one embodiment, the auxiliary processor 523 (e.g., an image signal processor or a communication processor) may be implemented as a part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 and/or the non-volatile memory 534.

The program 540 may be stored in the memory 530 as software, and may include, for example, an operating system (OS) 542, middleware 544, or an application 546.

The input device 550 may receive a command or data to be used by another component (e.g., the processor 520) of the electronic device 501, from the outside (e.g., a user) of the electronic device 501. The input device 550 may include, for example, a microphone, a mouse, and/or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to one embodiment, the receiver may be implemented as being separate from, or as a part of, the speaker.

The display device 560 may visually provide information to the outside (e.g., a user) of the electronic device 501. The display device 560 may include, for example, a display, a hologram device, and/or a projector and control circuitry to control a corresponding one of the display, the hologram device, and the projector. According to one embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to one embodiment, the audio module 570 may obtain the sound via the input device 550, and/or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 and/or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 577 may support one or more specified protocols to be used for the electronic device 501 to be coupled with the external electronic device 502 directly (e.g., wired) or wirelessly. According to one embodiment, the interface 577 may include, for example, a high definition multimedia interface (HDMI), a universal serial bus (USB) interface, a secure digital (SD) card interface, and/or an audio interface.

A connecting terminal 578 may include a connector via which the electronic device 501 may be physically connected with the external electronic device 502. According to one embodiment, the connecting terminal 578 may include, for example, an HDMI connector, a USB connector, an SD card connector, and/or an audio connector (e.g., a headphone connector).

The haptic module 579 may convert an electrical signal into a mechanical stimulus (e.g., a vibration or a movement) and/or an electrical stimulus which may be recognized by a user via tactile sensation or kinesthetic sensation. According to one embodiment, the haptic module 579 may include, for example, a motor, a piezoelectric element, and/or an electrical stimulator.

The camera module 580 may capture a still image or moving images. According to one embodiment, the camera module 580 may include one or more lenses, image sensors, image signal processors, and/or flashes.

The power management module 588 may manage power supplied to the electronic device 501. The power management module 588 may be implemented as at least a part of, for example, a power management integrated circuit (PMIC).

The battery 589 may supply power to at least one component of the electronic device 501. According to one embodiment, the battery 589 may include, for example, a primary cell which is not rechargeable, a secondary cell which is rechargeable, and/or a fuel cell.

The communication module 590 may support establishing a direct (e.g., wired) communication channel or a wireless communication channel between the electronic device 501 and the external electronic device (e.g., the electronic device 502, the electronic device 504, and/or the server 508) and performing communication via the established communication channel. The communication module 590 may include one or more communication processors that are operable independently from the processor 520 (e.g., the AP) and may support a direct (e.g., wired) communication and/or a wireless communication. According to one embodiment, the communication module 590 may include a wireless communication module 592 (e.g., a cellular communication module, a short-range wireless communication module, and/or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth®, wireless-fidelity (Wi-Fi) direct, and/or a standard of the Infrared Data Association (IrDA)) or the second network 599 (e.g., a long-range communication network, such as a cellular network, the Internet, and/or a computer network (e.g., LAN or wide area network (WAN)). Bluetooth® is a registered trademark of Bluetooth SIG, Inc., Kirkland, Wash. These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit and/or receive a signal and/or power to and/or from the outside (e.g., the external electronic device) of the electronic device 501. According to one embodiment, the antenna module 597 may include one or more antennas, and, therefrom, at least one antenna appropriate for a communication scheme used in the communication network, such as the first network 598 and/or the second network 599, may be selected, for example, by the communication module 590 (e.g., the wireless communication module 592). The signal and/or the power may then be transmitted and/or received between the communication module 590 and the external electronic device via the selected at least one antenna.

At least some of the above-described components may be mutually coupled and communicate signals (e.g., commands and/or data) therebetween via an inter-peripheral communication scheme (e.g., a bus, a general purpose input and output (GPIO), a serial peripheral interface (SPI), and/or a mobile industry processor interface (MIPI)).

According to one embodiment, commands and/or data may be transmitted and/or received between the electronic device 501 and the external electronic device 504 via the server 508 coupled with the second network 599. Each of the electronic devices 502 and 504 may be a device of a same type as, or a different type from, the electronic device 501. All or some of operations to be executed at or by the electronic device 501 may be executed at one or more of the external electronic devices 502, 504, or 508. For example, if the electronic device 501 should perform a function and/or a service automatically, or in response to a request from a user or another device, the electronic device 501, instead of, or in addition to, executing the function and/or the service, may request the one or more external electronic devices to perform at least a part of the function and/or the service. The one or more external electronic devices receiving the request may perform the at least a part of the function and/or the service requested, and/or an additional function and/or an additional service related to the request, and transfer an outcome of the performing to the electronic device 501. The electronic device 501 may provide the outcome, with or without further processing of the outcome, as at least a part of a reply to the request. To that end, a cloud computing, distributed computing, and/or client-server computing technology may be used, for example.

One embodiment may be implemented as software (e.g., the program 540) including one or more instructions that are stored in a storage medium (e.g., internal memory 536 or external memory 538) that is readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a compiler or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Herein, embodiments of the present disclosure are described in detail with reference to the accompanying drawings. It should be noted that same or similar elements may be designated by the same reference numerals/letters even though they are shown in different drawings. In the description herein, specific details such as detailed configurations and components are provided to assist with the overall understanding of the embodiments of the present disclosure. Various changes and modifications of the embodiments described herein may be made without departing from the scope of the present disclosure. Certain detailed descriptions may be omitted for clarity and conciseness.

The present disclosure provides for various modifications and various embodiments. It should be understood that the present disclosure is not limited to the various embodiments explicitly described or detailed herein, and that the present disclosure includes modifications, equivalents, and alternatives within the scope of the present disclosure.

Although terms including an ordinal number such as first, second, etc., may be used for describing various elements, the elements are not restricted by such terms. Such terms are used to distinguish one element from another element, and do not imply any specific ordering. As used herein, the term "and/or" includes any and all combinations of one or more associated items. Singular forms are intended to include plural forms unless the context clearly indicates otherwise. In the present disclosure, it should be understood that the terms "include" or "have" indicate the existence of a feature, a number, a step, an operation, a structural element, a part, or a combination thereof, and do not exclude the existence or probability of the addition of one or more other features, numbers, steps, operations, structural elements, parts, or combinations thereof.

According to one embodiment, at least one component (e.g., a manager, a set of processor-executable instructions, a program, or a module) of the above-described components may include a single entity or multiple entities. One or more of the above-described components may be omitted, or one or more other components may be added. Alternatively or additionally, a plurality of components (e.g., a manager, a set of processor-executable instructions, a program, or a module) may be integrated into a single component. In this case, the integrated component may still perform one or more functions of each of the plurality of components in the same or similar manner as they are performed by a corresponding one of the plurality of components before the integration. Operations performed by the manager, the set of processor-executable instructions, the program, the module, or another component may be carried out sequentially, in parallel, repeatedly, or heuristically, or one or more of the operations may be executed in a different order or omitted, or one or more other operations may be added.

What is claimed is:

1. A method of optimizing at least one in-phase (I) and quadrature (Q) mismatch compensator (MC) parameter value for at least one IQMC parameter of an IQMC, comprising:
   setting an iteration index to a first index;
   generating a set of tested IQMC candidate parameter values corresponding to the first index by performing an iterative method until an exit condition is reached, at least one iteration of the iterative method comprising:
      selecting a first IQMC candidate parameter value for the at least one parameter of the IQMC;
      determining, using the first IQMC candidate parameter value, a performance metric value that comprises at least one of (i) an image rejection ratio (IRR) value, (ii) a signal-to-interference-plus-noise ratio (SINR) value, or (iii) a signal-to-image ratio (SImR) value;
      determining, to update the first IQMC candidate parameter value based on a set of criteria; and
      determining, in response to the determining to update the first IQMC candidate parameter value, a second IQMC candidate parameter value that is an update to the first IQMC candidate parameter value,
      wherein the set of tested IQMC test parameters includes at least the first IQMC candidate parameter value and the second IQMC candidate parameter value,
   generating a second set of IQMC candidate parameter values corresponding to a second index that is incremented from the first index, and
   selecting the iteration index corresponding to an IQMC candidate parameter value of the set of tested IQMC candidate parameter values that optimizes the performance metric.

2. The method of claim 1, wherein the iterative method is a gradient ascent method or a gradient descent method, and the iterative method further comprises calculating a gradient of the performance metric.

3. The method of claim 2, wherein the gradient ascent method or the gradient descent method uses a cost function that is a function of the at least one IQMC parameter.

4. The method of claim 3, wherein the cost function is further a function of I and Q mismatch (IQMM) parameters corresponding to an up-conversion circuit or a down-conversion circuit that is connected, directly or indirectly, to the IQMC.

5. The method of claim 3, wherein the at least one IQMC parameter includes at least one tap weight of a filter of the IQMC.

6. The method of claim 5, wherein the IQMC comprises a real-valued compensator (RVC) that includes a multiplier, and the at least one IQMC parameter includes a real-valued cross-multiplication factor that is input to the multiplier.

7. The method of claim 1, wherein the IQMC comprises a complex-valued compensator (CVC).

8. The method of claim 1, wherein the IQMC comprises a real-valued compensator (RVC).

9. The method of claim 1, wherein the performance metric value comprises the IRR value, and the IRR value is a minimum IRR value of a set of IRR values of the IQMC, the set of IRR values corresponding to different frequencies.

10. The method of claim 1, wherein the performance metric value comprises the IRR value, and the IRR value is a minimum arithmetic or geometric mean of IRR values per carrier cell (CC) in a carrier aggregation (CA) scheme.

11. A device configured to optimize at least one in-phase (I) and quadrature (Q) mismatch compensator (MC) parameter value for at least one IQMC parameter of an IQMC, comprising:
  a processor; and
  non-transitory processor-executable media storing instructions that, when executed by the processor, cause the processor to:
    set an iteration index to a first index;
    generate a set of tested IQMC candidate parameter values corresponding to the first index by performing an iterative method until an exit condition is reached, at least one iteration of the iterative method comprising:
      selecting a first IQMC candidate parameter value for the at least one parameter of the IQMC;
      determining, using the first IQMC candidate parameter value, a performance metric value that comprises at least one of (i) an image rejection ratio (IRR) value, (ii) a signal-to-interference-plus-noise ratio (SINR) value, or (iii) a signal-to-image ratio (SImR) value;
      determining, to update the first IQMC candidate parameter value based on a set of criteria; and
      determining, in response to the determining to update the first IQMC candidate parameter value, a second IQMC candidate parameter value that is an update to the first IQMC candidate parameter value,
      wherein the set of tested IQMC test parameters includes at least the first IQMC candidate parameter value and the second IQMC candidate parameter value,
    generating a second set of IQMC candidate parameter values corresponding to a second index that is incremented from the first index, and
    selecting the iteration index corresponding to an IQMC candidate parameter value of the set of tested IQMC candidate parameter values that optimizes the performance metric.

12. The device of claim 11, wherein the iterative method is a gradient ascent method or a gradient descent method, and the iterative method further comprises calculating a gradient of the performance metric.

13. The device of claim 12, wherein the gradient ascent method or the gradient descent method uses a cost function that is a function of the at least one IQMC parameter.

14. The device of claim 13, wherein the cost function is further a function of I and Q mismatch (IQMM) parameters corresponding to an up-conversion circuit or a down-conversion circuit that is connected, directly or indirectly, to the IQMC.

15. The device of claim 13, wherein the at least one IQMC parameter includes at least one tap weight of a filter of the IQMC.

16. The device of claim 15, wherein the IQMC comprises a real-valued compensator (RVC) that includes a multiplier, and the at least one IQMC parameter includes a real-valued cross-multiplication factor that is input to the multiplier.

17. The device of claim 11, wherein the IQMC comprises a complex-valued compensator (CVC).

18. The device of claim 11, wherein the IQMC comprises a real-valued compensator (RVC).

19. The device of claim 11, wherein the performance metric value comprises the IRR value, and the IRR value is a minimum IRR value of a set of IRR values of the IQMC, the set of IRR values corresponding to different frequencies.

20. The device of claim 11, wherein the performance metric value comprises the IRR value, and the IRR value is a minimum arithmetic or geometric mean of IRR values per carrier cell (CC) in a carrier aggregation (CA) scheme.

* * * * *